(12) United States Patent
Uchida

(10) Patent No.: US 7,454,734 B2
(45) Date of Patent: Nov. 18, 2008

(54) METHOD OF DESIGNING LAYOUT OF SEMICONDUCTOR INTEGRATED CIRCUIT AND APPARATUS FOR DOING THE SAME

(75) Inventor: Kohei Uchida, Tokyo (JP)

(73) Assignee: Nec Corporation, Tokyo (JP)

( * ) Notice: Subject to any disclaimer, the term of this patent is extended or adjusted under 35 U.S.C. 154(b) by 281 days.

(21) Appl. No.: 11/376,178

(22) Filed: Mar. 16, 2006

(65) Prior Publication Data

US 2006/0236283 A1    Oct. 19, 2006

(30) Foreign Application Priority Data

Mar. 25, 2005    (JP)    ............... 2005-089011

(51) Int. Cl.
  *G06F 17/50*    (2006.01)
(52) U.S. Cl. .......................................... 716/10
(58) Field of Classification Search ............. 716/10
  See application file for complete search history.

(56) References Cited

U.S. PATENT DOCUMENTS 6,305,002 B1 * 10/2001 Uchida ...................... 716/12
6,480,992 B1 * 11/2002 Runyon ..................... 716/10
6,546,538 B1 *  4/2003 Rubdi et al. ............... 716/12

FOREIGN PATENT DOCUMENTS

| JP | 7-106521 | 4/1995 |
| JP | 10-144797 | 5/1998 |
| JP | 11-168177 | 6/1999 |
| JP | 2001-203272 | 7/2001 |

* cited by examiner

*Primary Examiner*—Jack Chiang
*Assistant Examiner*—Brandon W Bowers
(74) *Attorney, Agent, or Firm*—Young & Thompson

(57) ABSTRACT

A method of designing a layout of functional blocks and on-chip capacitors in a semiconductor integrated circuit, includes the steps of, in sequence, (a) placing a functional block, (b) placing an on-chip capacitor in an area which remains vacant after the step (a) has been carried out, (c) overlapping a portion of the functional block having been placed in the step (a) and a portion of the on-chip capacitor having been placed in the step (b) each other, if possible, and (d) placing an on-chip capacitor in a vacant area caused by carrying out the step (c).

26 Claims, 20 Drawing Sheets

FIG.9

OVERLAPPING-ACTION LIBRARY

| NAME OF ELEMENT | PRIORITY OF ELEMENT | LAYOUT OF OVERLAPPABLE ELEMENT | TYPE OF OVERLAPPABLE ELEMENT (RIGHT · LEFT) |
|---|---|---|---|
| FIRST FUNCTIONAL BLOCK | 1 | RIGHT | FIRST · – |
| SECOND FUNCTIONAL BLOCK | 2 | RIGHT · LEFT | FIRST · SECOND |
| THIRD FUNCTIONAL BLOCK | 3 | LEFT | – · SECOND |
| ... | | | |
| FIRST ON-CHIP CAPACITOR | – | RIGHT | FIRST · – |
| SECOND ON-CHIP CAPACITOR | – | LEFT | – · FIRST |
| THIRD ON-CHIP CAPACITOR | – | RIGHT · LEFT | SECOND · SECOND |
| ... | | | |

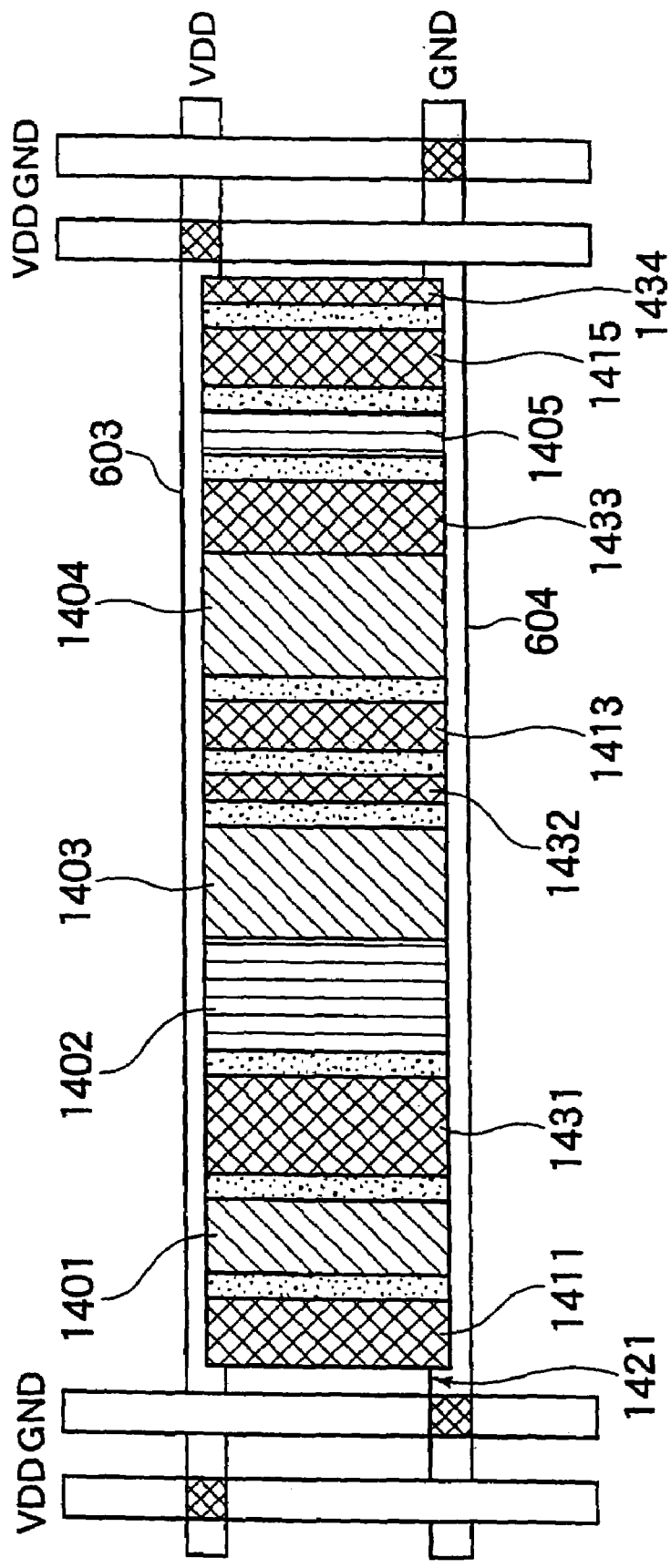

METHOD OF DESIGNING LAYOUT OF SEMICONDUCTOR INTEGRATED CIRCUIT AND APPARATUS FOR DOING THE SAME

BACKGROUND OF THE INVENTION

1. Field of the Invention

The invention relates to a method of designing a layout of a semiconductor integrated circuit, a program for causing a computer to carry out the method, a method of fabricating a semiconductor integrated circuit, and an apparatus for designing a layout of a semiconductor integrated circuit.

2. Description of the Related Art

An internal circuit in a semiconductor integrated circuit such as LSI (Large Scale Integration) is accompanied with a problem that electrical noises generated when the internal circuit operates cause fluctuation in delay and malfunction.

For instance, such electrical noises are caused by fluctuation in a voltage of a power-source line, generated when a transistor is turned on or off.

Such electrical noises can be reduced by means of an on-chip capacitor arranged in LSI.

An on-chip capacitor is disposed usually in a vacant area formed between functional blocks disposed adjacent to each other. However, for instance, if such a vacant area is too small to place an on-chip capacitor therein, a fill-cell is placed in the vacant are in order merely to delete a space, namely, the vacant area.

For instance, Japanese Patent Application Publication No. 11-168177 (published June, 1999) has suggested a method of arranging a functional block and an on-chip capacitor in LSI.

FIG. 1 is a flow chart showing steps to be carried out in the method.

As illustrated in FIG. 1, first, functional blocks are placed so as to satisfy requirements such as connection indicated in a net list, a given delay, and a density of functional blocks, in step S201.

Then, there are fabricated on-chip capacitors each having a size equal to a size of each of spaces or vacant areas where functional blocks were not placed, and the thus fabricated on-chip capacitors are placed in the spaces, in step S202.

Then, fill-cells are placed in remaining spaces in which on-chip capacitors cannot be placed because the spaces are too small to place an on-chip capacitor therein, in step S203.

In the method shown in FIG. 1, a layout of the functional blocks is designed (step S201) before a layout of the on-chip capacitors is designed (step S202).

As described in the above-mentioned Publication, an on-chip capacitor is preferably disposed in the vicinity of a functional block in order to reduce electrical noises.

However, the method suggested in the above-mentioned Publication is accompanied with a problem that since an on-chip capacitor is disposed in a space where functional blocks have not been placed, it is not always for an on-chip capacitor to be disposed in the vicinity of a functional block, resulting in insufficient reduction in electrical noises.

In the method suggested in the above-mentioned Publication, as a density of functional blocks per a unit area becomes high, a lot of very small spaces or vacant area is formed between functional blocks. In order to place a functional block, a space has to have a certain width or area. However, since very small spaces exist a lot, it would not be possible to effectively arrange on-chip capacitors, resulting in insufficient reduction in electrical noises.

Japanese Patent Application Publication No. 7-106521 (published Apr. 21, 1995) has suggested a semiconductor integrated circuit device including a capacitor cell comprised of a N-channel MOS transistor having a gate terminal electrically connected to a power source, and a source terminal grounded, and a P-channel MOS transistor having a gate terminal grounded. The capacitor cell is mounted on a wiring area formed after automatic configuration and routing, ensuring that a bypass capacitor is accomplished in LSI.

Japanese Patent Application Publication No. 10-144797 (published May 29, 1998) has suggested a method of designing a semiconductor integrated circuit including a device formed on a semiconductor substrate, a plurality of electrically insulating layers and a plurality of wiring layers alternately formed above the semiconductor substrate, and via-contacts composed of electrically conductive material and filling therewith a plurality of via-holes formed throughout the electrically insulating layers, wherein wirings formed in different wiring layers from each other are electrically connected to each other through the via-contacts, and the device and a wiring formed in any one of the wiring layers are electrically connected to each other through the via-contacts, the method including the steps of selecting one of a current direction, a waveform of current, material of which a wiring is composed, material of which the via-contacts are composed, a wiring length, a wiring width, a wiring area, a wiring volume, a wiring thickness, and overlapping margin as a specific parameter affecting resistance to electromigration at an interface between the wirings and the via-contacts, dividing an allowable current in the via-holes into a plurality of zones in accordance with conditions relating to the specific parameter, selecting a typical current common to the zones, determining a typical current in a zone associated with the specific parameter, as an allowable current in each of the via-holes, and determining a total opening area of the via-holes and a shape of the wirings in accordance with the allowable current.

Japanese Patent Application Publication No. 2001-203272 (published Jul. 27, 2001) has suggested a method of designing a layout of a semiconductor integrated circuit, including the steps of designing a layout of functional blocks, a signal-line layout for electrically connecting the functional blocks to one another, and a wiring layout including a power-source wiring layout and a ground layout, filling a vacant area defined as an area except the functional block layout and the wiring layout with a dummy pattern for controlling an area rate, and fabricating a capacity layout including a plurality of capacity electrode layer layouts disposed in a dummy area filled with the dummy pattern, and electrically connected to one of the power-source wiring layout and the ground layout.

SUMMARY OF THE INVENTION

In view of the above-mentioned problems in the prior art, it is an object of the present invention to provide a method of designing a layout of a semiconductor integrated circuit, a program for causing a computer to carry out the method, a method of fabricating a semiconductor integrated circuit, and an apparatus for designing a layout of a semiconductor integrated circuit, all of which are capable of reducing electrical noises in comparison with the prior art.

In one aspect of the present invention, there is provided a method of designing a layout of functional blocks and on-chip capacitors in a semiconductor integrated circuit, including the steps of, in sequence, (a) placing a functional block, (b) placing an on-chip capacitor in an area which remains vacant after the step (a) has been carried out, (c) overlapping a portion of the functional block having been placed in the step (a) and a portion of the on-chip capacitor having been placed in the step (b) each other, if possible, and (d) placing an on-chip capacitor in a vacant area caused by carrying out the step (c).

For instance, the step (c) may include the steps of (c1) judging, in an order of predetermined priority assigned to all of the functional blocks having been placed in the step (a), whether it is possible to overlap the functional blocks and the on-chip capacitor having been placed in the step (b) each other, and (c2) overlapping the functional blocks and the on-chip capacitor each other, if possible.

For instance, the step (d) may include the step (e) of, if there exists a library of a first on-chip capacitor having a size equal to a sum of a size of the on-chip capacitor having been overlapped in the step (c) and a size of the vacant area, replacing the on-chip capacitor having been overlapped in the step (c) with the first on-chip capacitor.

It is preferable that the step (e) is carried out to all of the on-chip capacitors having been placed in the step (b) in an order of a priority assigned to the functional blocks placed adjacent to the on-chip capacitors.

For instance, the step (d) may include the step (f) of, if there does not exist a library of a first on-chip capacitor having a size equal to a sum of a size of the on-chip capacitor having been overlapped in the step (c) and a size of the vacant area, placing an on-chip capacitor in the vacant area, the on-chip capacitor being equal in size to the vacant area.

It is preferable that the on-chip capacitor to be placed in the step (D is placed overlapping an on-chip capacitor disposed adjacent to the on-chip capacitor.

For instance, the step (d) may include the steps of (g) sorting all of the functional blocks having been placed in the step (a), in an order of a predetermined priority assigned to the functional blocks, (h) successively changing a target functional block in accordance with the order resulted from the step (g), (i) judging whether an on-chip capacitor is disposed adjacent to the target functional block, a vacant area exists adjacent to the on-chip capacitor, and another functional block is disposed adjacent to the vacant area, (j) comparing a priority assigned to the another functional block with a priority assigned to the target on-chip capacitor, if the another functional block is judged to be disposed adjacent to the vacant area, and (k) replacing the on-chip capacitor with an on-chip capacitor having a size equal to a sum of a size of the on-chip capacitor and a size of the vacant area, if a priority assigned to the target on-chip capacitor is judged in the step (j) higher than a priority assigned to the another functional block.

For instance, the step (d) may include the step (l) of, if a priority assigned to the target functional block is judged in the step (j) equal to a priority assigned to the another o functional block, replacing the on-chip capacitor with an on-chip capacitor having a size equal to a sum of a size of the on-chip capacitor and a half of a size of the vacant area.

For instance, the step (d) may include the step (m) of, if a priority assigned to the another functional block is judged in the step (j) higher than a priority assigned to the target functional block, remaining the vacant area vacant.

It is preferable that the method further includes the step (n) of, if there exists a library of an on-chip capacitor having a size equal to a sum of sizes of two on-chip capacitors disposed adjacent to each other, replacing the two on-chip capacitors with a single on-chip capacitor having a size equal to the sum.

It is preferable that the method further includes the step (o) of, if there does not exist a library of an on-chip capacitor having a size equal to a sum of sizes of two on-chip capacitors disposed adjacent to each other, and there exists a vacant area between the two on-chip capacitors, placing an on-chip capacitor in the vacant area such that the on-chip capacitor overlaps the two on-chip capacitors.

It is preferable that the method further includes the step (p) of preparing a database storing libraries of functional blocks and libraries of on-chip capacitors having different sizes from one another, wherein a layout of an output inverter of the functional blocks and a layout of a power-source terminal of the on-chip capacitors are standardized into several layouts, an output inverter and a power-source terminal associated with each other with respect to a layout can be overlapped each other, and power-source terminals associated with each other with respect to a layout can be overlapped each other.

In another aspect of the present invention, there is provided a program for causing a computer to carry out the above-mentioned method of designing a layout of functional blocks and on-chip capacitors in a semiconductor integrated circuit.

In still another aspect of the present invention, there is provided a method of fabricating a semiconductor integrated circuit including a functional block and an on-chip capacitor both formed on a substrate or an electrically insulating layer, including the step of fabricating a functional block and an on-chip capacitor on a substrate or an electrically insulating layer in accordance with a layout which is determined by the steps of (a) placing a functional block, (b) placing an on-chip capacitor in an area which is vacant after the step (a) has been carried out, (c) overlapping a portion of the functional block having been placed in the step (a) and a portion of the on-chip capacitor having been placed in the step (b) each other, if possible, and (d) placing an on-chip capacitor in a vacant area caused by carrying out the step (c).

In yet another aspect of the present invention, there is provided an apparatus for designing a layout of functional blocks and on-chip capacitors in a semiconductor integrated circuit, including (a) a functional block placer which places a functional block, (b) a first on-chip capacitor placer which places an on-chip capacitor in an area which remains vacant after the functional block has been placed by the functional block placer, (c) an overlapping unit which overlaps a portion of the functional block having been placed by the functional block placer and a portion of the on-chip capacitor having been placed by the on-chip capacitor placer each other, if possible, and (d) a second on-chip capacitor placer which places an on-chip capacitor in a vacant area resulted from overlapping the portions of the functional block and the on-chip capacitor.

It is preferable that the overlapping unit carries out judging, in an order of a predetermined priority assigned to all of the functional blocks having been placed by the functional block placer, whether it is possible to overlap the functional blocks and the on-chip capacitor having been placed by the first on-chip capacitor placer each other, and overlapping the functional blocks and the on-chip capacitor each other, if possible.

It is preferable that the second on-chip capacitor placer which, if there exists a library of a first on-chip capacitor having a size equal to a sum of a size of the on-chip capacitor having been overlapped by the overlapping unit and a size of the vacant area, replaces the on-chip capacitor having been overlapped by the overlapping unit with the first on-chip capacitor.

It is preferable that the second on-chip capacitor placer carries out the replacement to all of the on-chip capacitors having been placed by the first on-chip capacitor placer in an order of a priority assigned to the functional blocks placed adjacent to the on-chip capacitors.

It is preferable that the second on-chip capacitor placer includes a third on-chip capacitor placer which, if there does not exist a library of a first on-chip capacitor having a size equal to a sum of a size of the on-chip capacitor having been overlapped by the overlapping unit and a size of the vacant area, places an on-chip capacitor in the vacant area, the on-chip capacitor being equal in size to the vacant area.

It is preferable that the third on-chip capacitor placer places the on-chip capacitor such that the on-chip capacitor overlaps an on-chip capacitor disposed adjacent to the on-chip capacitor.

It is preferable that the second on-chip capacitor placer carries out sorting all of the functional blocks having been placed by the functional block placer, in an order of a predetermined priority assigned to the functional blocks, successively changing a target functional block in accordance with the order resulted from the sorting, judging whether an on-chip capacitor is disposed adjacent to the target functional block, a vacant area exists adjacent to the on-chip capacitor, and another functional block is disposed adjacent to the vacant area, comparing a priority assigned to the another functional block with a priority assigned to the target on-chip capacitor, if the another functional block is judged to be disposed adjacent to the vacant area, and replacing the on-chip capacitor with an on-chip capacitor having a size equal to a sum of a size of the on-chip capacitor and a size of the vacant area, if a priority assigned to the target on-chip capacitor is judged higher than a priority assigned to the another functional block.

It is preferable that the second on-chip capacitor placer which, if a priority assigned to the target functional block is judged equal to a priority assigned to the another o functional block, replaces the on-chip capacitor with an on-chip capacitor having a size equal to a sum of a size of the on-chip capacitor and a half of a size of the vacant area.

It is preferable that the second on-chip capacitor placer which, if a priority assigned to the another functional block is judged higher than a priority assigned to the target functional block, remains the vacant area vacant.

The apparatus may further include an on-chip capacitor merger which, if there exists a library of an on-chip capacitor having a size equal to a sum of sizes of two on-chip capacitors disposed adjacent to each other, replaces the two on-chip capacitors with a single on-chip capacitor having a size equal to the sum.

It is preferable that if there does not exist a library of an on-chip capacitor having a size equal to a sum of sizes of two on-chip capacitors disposed adjacent to each other, and there exists a vacant area between the two on-chip capacitors, the on-chip capacitor merger places an on-chip capacitor in the vacant area such that the on-chip capacitor overlaps the two on-chip capacitors.

The apparatus may further include a database storing libraries of functional blocks and libraries of on-chip capacitors having different sizes from one another, wherein a layout of an output inverter of the functional blocks and a layout of a power-source terminal of the on-chip capacitors are standardized into several layouts, an output inverter and a power-source terminal associated with each other with respect to a layout can be overlapped each other, and power-source terminals associated with each other with respect to a layout can be overlapped each other.

The advantages obtained by the aforementioned present invention will be described hereinbelow.

In accordance with the present invention, a portion of a functional block and a portion of an on-chip capacitor are caused to overlap each other, if possible. As a result, there is formed a space or vacant area equal in size to an area in which the portions overlap each other.

In addition, since an on-chip capacitor is placed in the thus formed space or vacant area, it would be possible to increase a total capacity of on-chip capacitors beyond a total capacity of on-chip capacitors in the conventional method, ensuring further reduction in electrical noises in comparison with the conventional method.

Specifically, for instance, a layout of an output inverter of functional blocks and a layout of a power-source terminal of on-chip capacitors are standardized into several layouts. Thus, it would be possible to overlap each other an output inverter and a power-source terminal associated with each other with respect to a layout, or overlap each other power-source terminals associated with each other with respect to a layout. Thus, an on-chip capacitor or on-chip capacitors is(are) placed in a vacant area formed as a result of overlapping an output inverter and a power-source terminal or power-source terminals each other. Accordingly, it would be possible to place on-chip capacitors in a greater number than the conventional method.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 9 illustrates an example of an overlapping-action library.

FIG. 18 is a plan view illustrating how a layout of functional blocks and on-chip capacitors in a chip varies in accordance with the steps shown in FIG. 11.

DESCRIPTION OF THE PREFERRED EMBODIMENTS

Preferred embodiments in accordance with the present invention will be explained hereinbelow with reference to drawings.

First Embodiment

Figure 1:
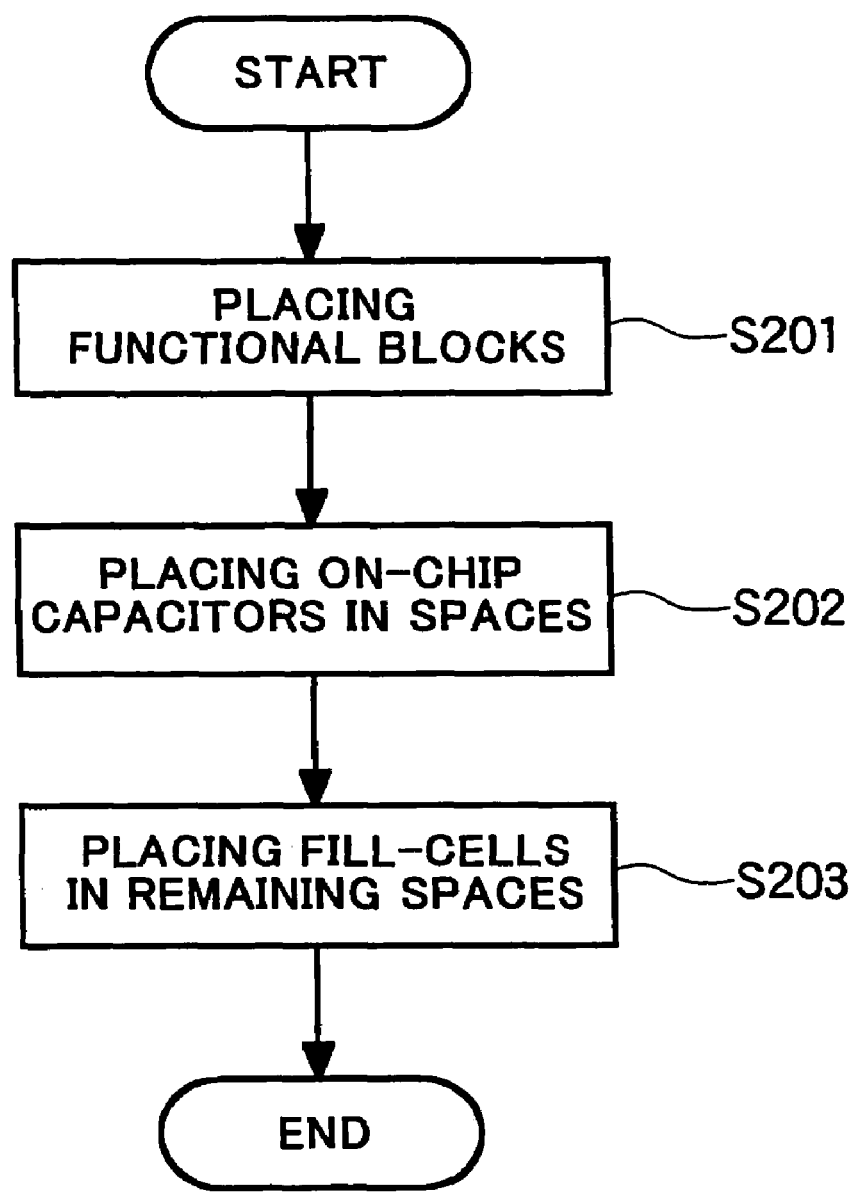
FIG. 1 is a flow chart showing steps to be carried out in the conventional method.
Figure 2:
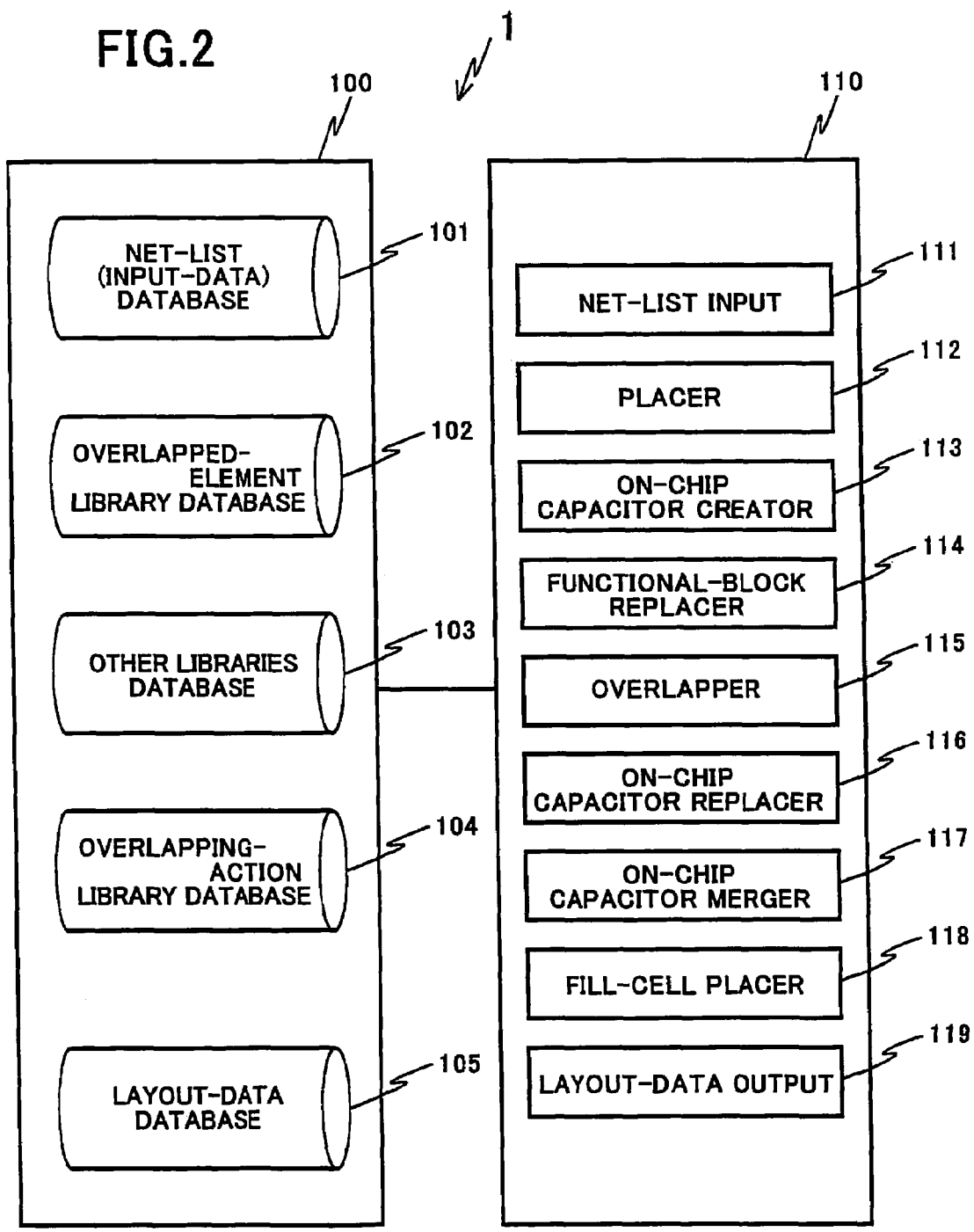
FIG. 2 is a block diagram of an apparatus for placing functional blocks, in accordance with the first embodiment of the present invention.

FIG. 2 is a block diagram of an apparatus 1 for placing functional blocks, in accordance with the first embodiment of the present invention.

The apparatus 1 is used to design a layout of functional blocks on a substrate or an electrically insulating layer of a semiconductor integrated circuit such as LSI.

As illustrated in FIG. 2, the apparatus 1 is comprised of a memory 100 storing various data therein, and a controller 110 designing a layout of functional blocks in dependence on data stored in the memory 100.

The apparatus 1 for placing functional blocks is comprised of a computer-aided design (CAD) unit, for instance. For instance, the apparatus 1 includes a display unit (not illustrated) controlled by the controller 110 to display various images thereon, and an interface (not illustrated) through which a user operates the apparatus 1, apart from the memory 100 and the controller 110.

The memory 100 supplies data to the controller 110. The memory 100 stores therein net-list (or input data) database 101, overlapped-element library database 102, other libraries database 103, overlapping-action library database 104, and layout-data database 105.

The net-list database 101 stores a net list in which data about electrical connection between functional blocks is written.

The overlapped-element library database 102 stores a library of functional blocks which can be overlapped with other functional blocks or on-chip capacitors, and a library of on-chip capacitors having various sizes or widths to overlap other functional blocks or on-chip capacitors.

Figure 3:
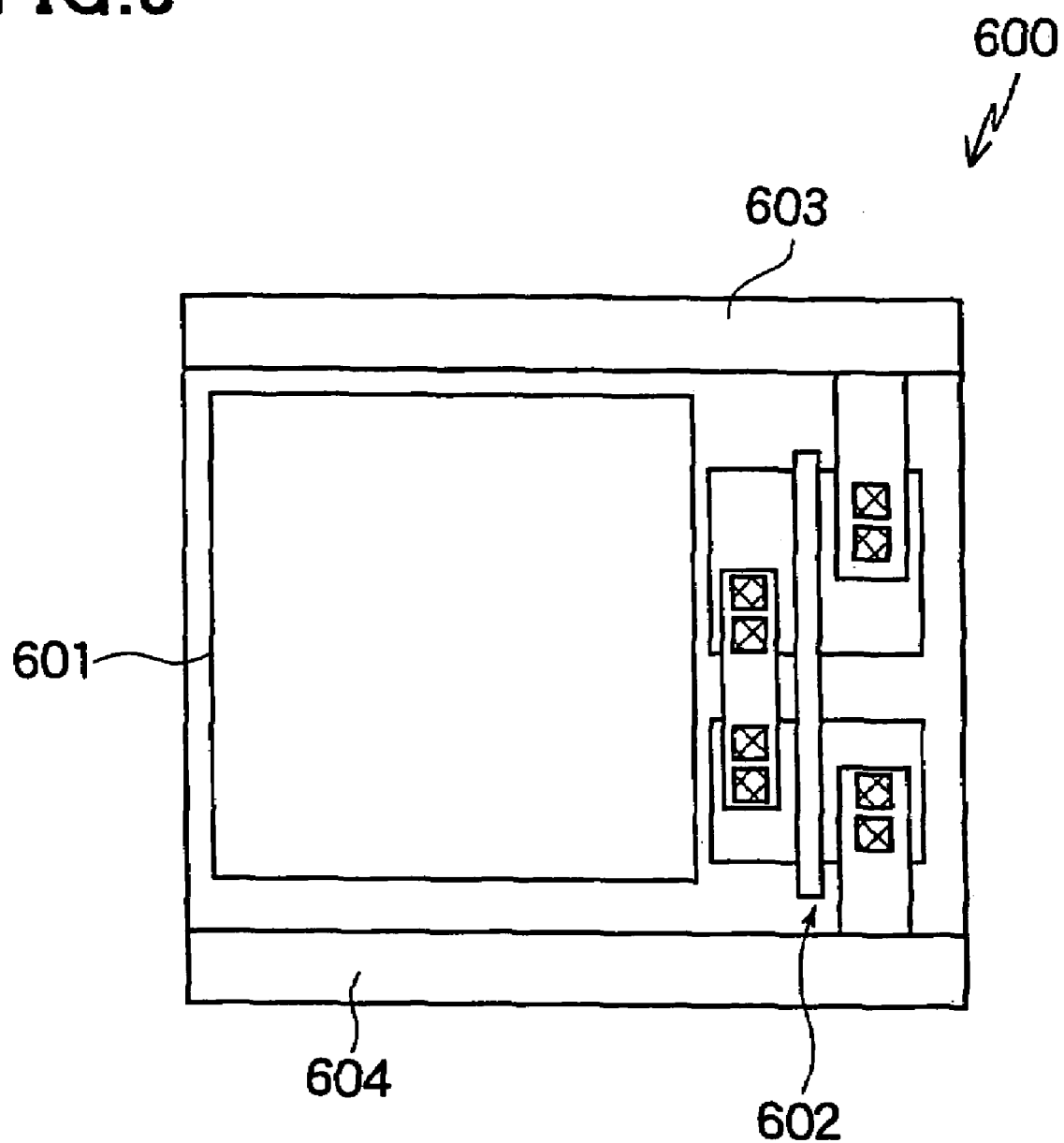
FIG. 3 is a plan view of an overlappable functional block.
Figure 4:
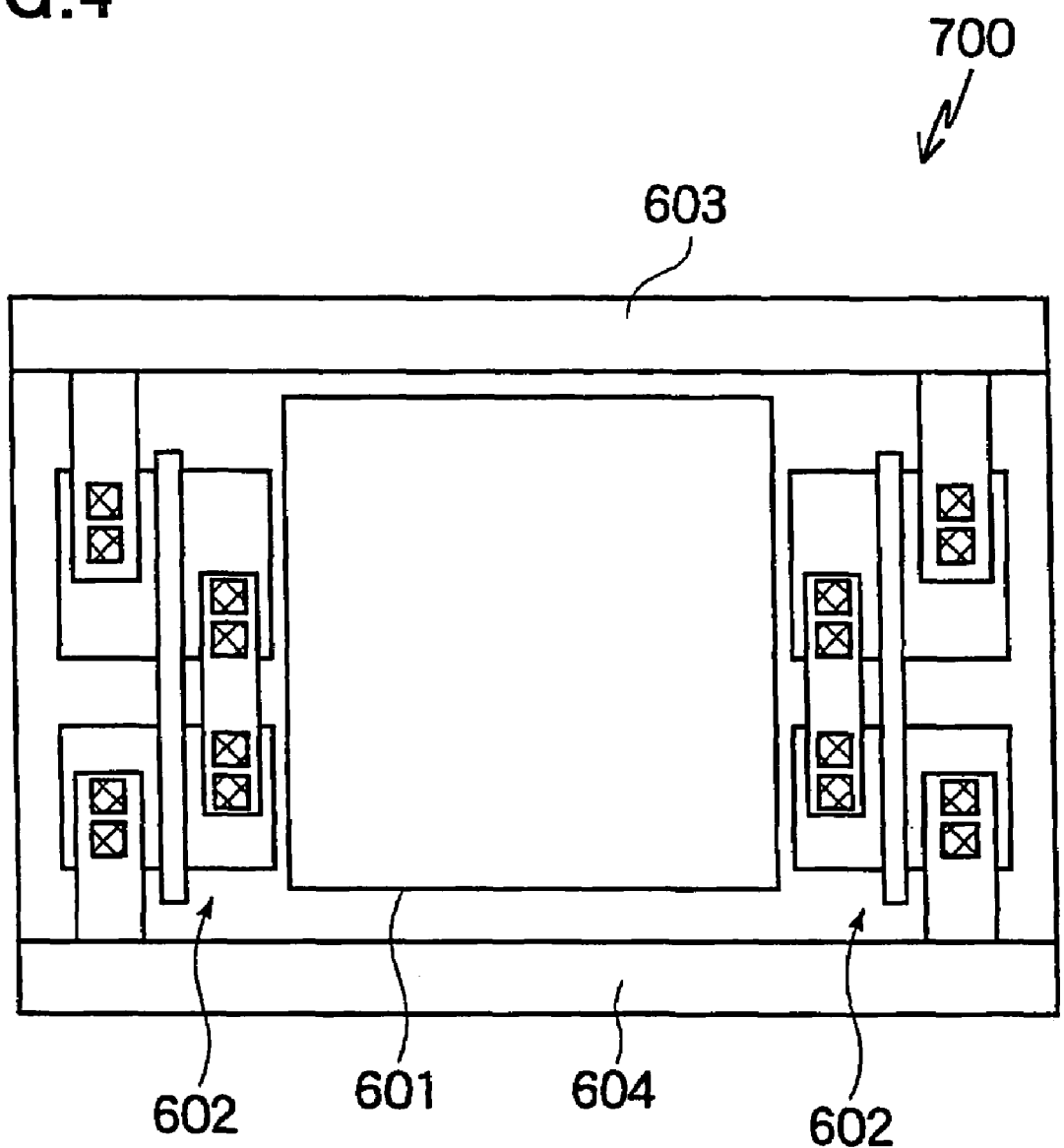
FIG. 4 is a plan view of an overlappable functional block.
Figure 5:
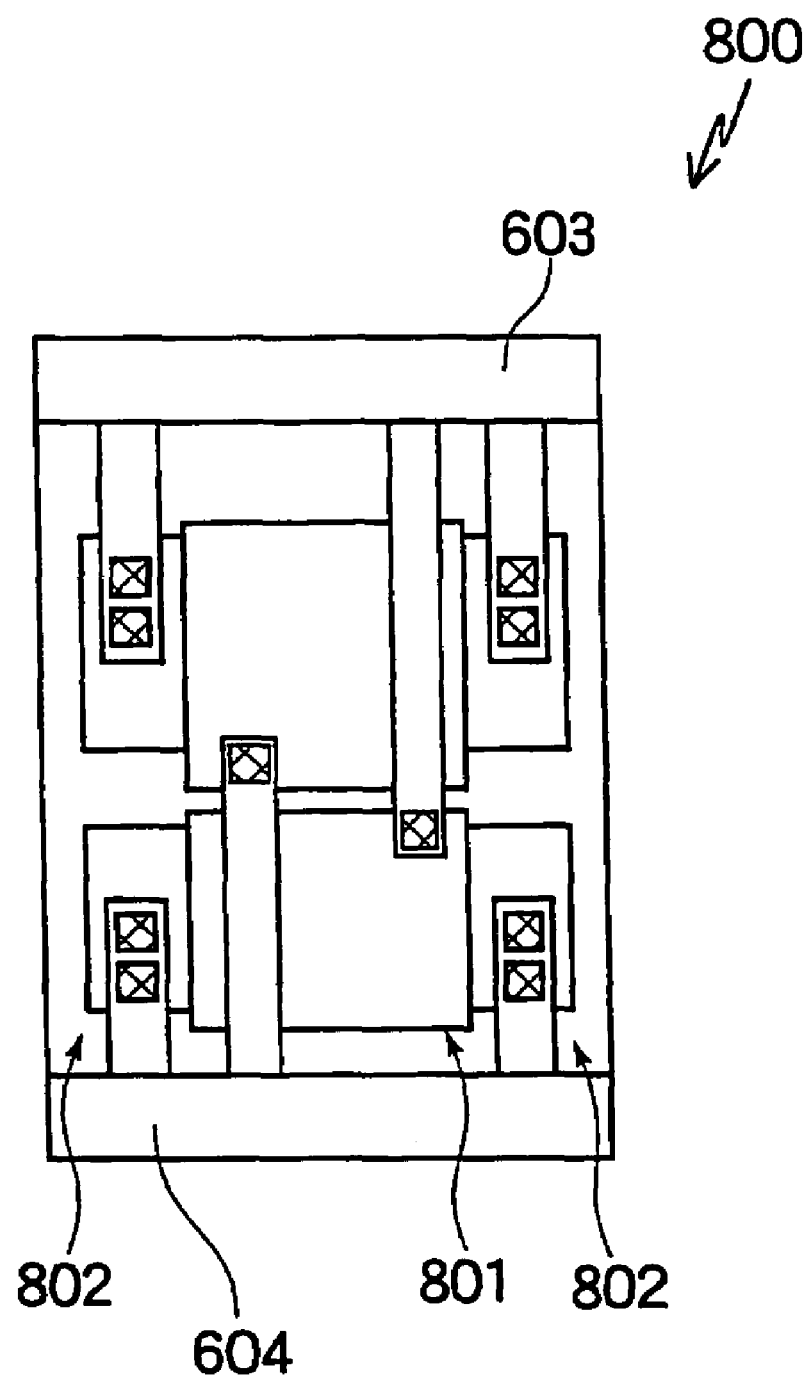
FIG. 5 is a plan view of an overlappable on-chip capacitor.
Figure 6:
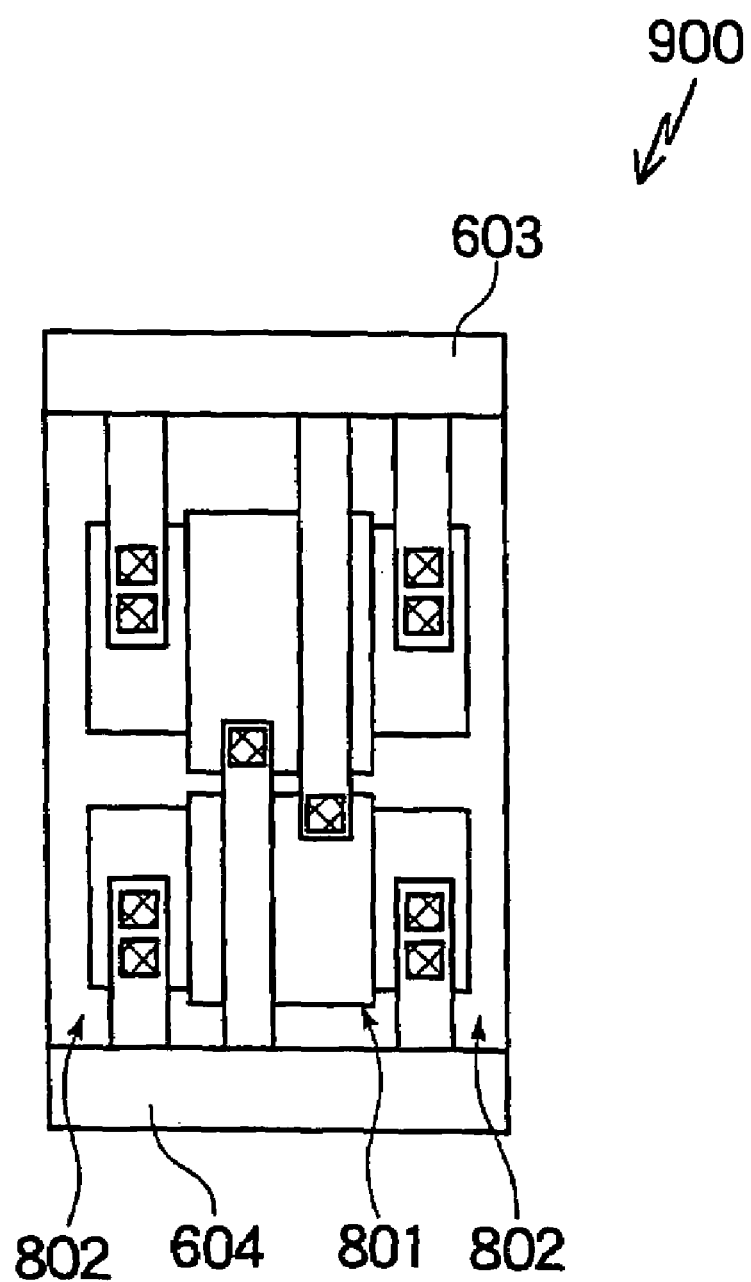
FIG. 6 is a plan view of an overlappable on-chip capacitor.

Each of FIGS. 3 and 4 is a plan view illustrating an example of a functional block having a library stored in the overlapped-element library database 102, and each of FIGS. 5 and 6 is a plan view illustrating an example of an on-chip capacitor having a library stored in the overlapped-element library database 102.

For instance, as illustrated in FIGS. 3 and 4, a functional block of CMOS is usually comprised of a functional element 601 and an output inverter 602, and is usually sandwiched between a power-source line 603 and a grounded line 604.

For instance, a functional block comprises a flip-flop, a selector, an EX-OR (XOR) or a multiplexer.

In the apparatus 1 in accordance with the first embodiment, a layout and a shape of an output inverter 602 are standardized in a functional block having a library stored in the overlapped-element library database 102.

Specifically, an output inverter 602 is disposed at a right end, a left end or opposite ends of a functional block.

For instance, in a functional block 600 illustrated in FIG. 3, an output inverter 602 is disposed only at the right of a functional element 601. Though not illustrated, an output inverter 602 may be disposed only at the left of a functional element 601.

In a functional block 700 illustrated in FIG. 4, output inverters 602 are disposed at the right and left of a functional element 601.

In a functional block having a library stored in the overlapped-element library database 102, a layout of an output inverter 602 is selected from a plurality of standardized layouts, as mentioned later in detail.

For instance, as illustrated in FIGS. 5 and 6, an on-chip capacitor is comprised of a capacity 801 and a power-source terminal(s) 802 disposed at either side or opposite sides about the capacity 801, and is sandwiched between a power-source line 603 and a grounded line 604.

For instance, each of on-chip capacitors 800 and 900 illustrated in FIGS. 5 and 6 is comprised of a capacity 801 and power-source terminals 802 disposed at opposite sides about the capacity 801.

The on-chip capacitor 800 illustrated in FIG. 5 and the on-chip capacitor 900 illustrated in FIG. 6 are identical in structure to each other except a size of the capacity 801.

Though not illustrated, the power-source terminal 802 may be disposed at either side (namely, at right or left side) about the capacity 801.

A layout of the power-source terminal 802 of an on-chip capacitor having a library stored in the overlapped-element library database 102 is designed to be coincident with a layout of the output inverter 602 of a functional block having a library stored in the overlapped-element library database 102.

If a layout of the power-source terminal 802 of an on-chip capacitor is coincide with a layout of the output inverter 602 of a functional block, the output inverter 602 and the power-source terminal 802 can be overlapped each other.

Figure 7:
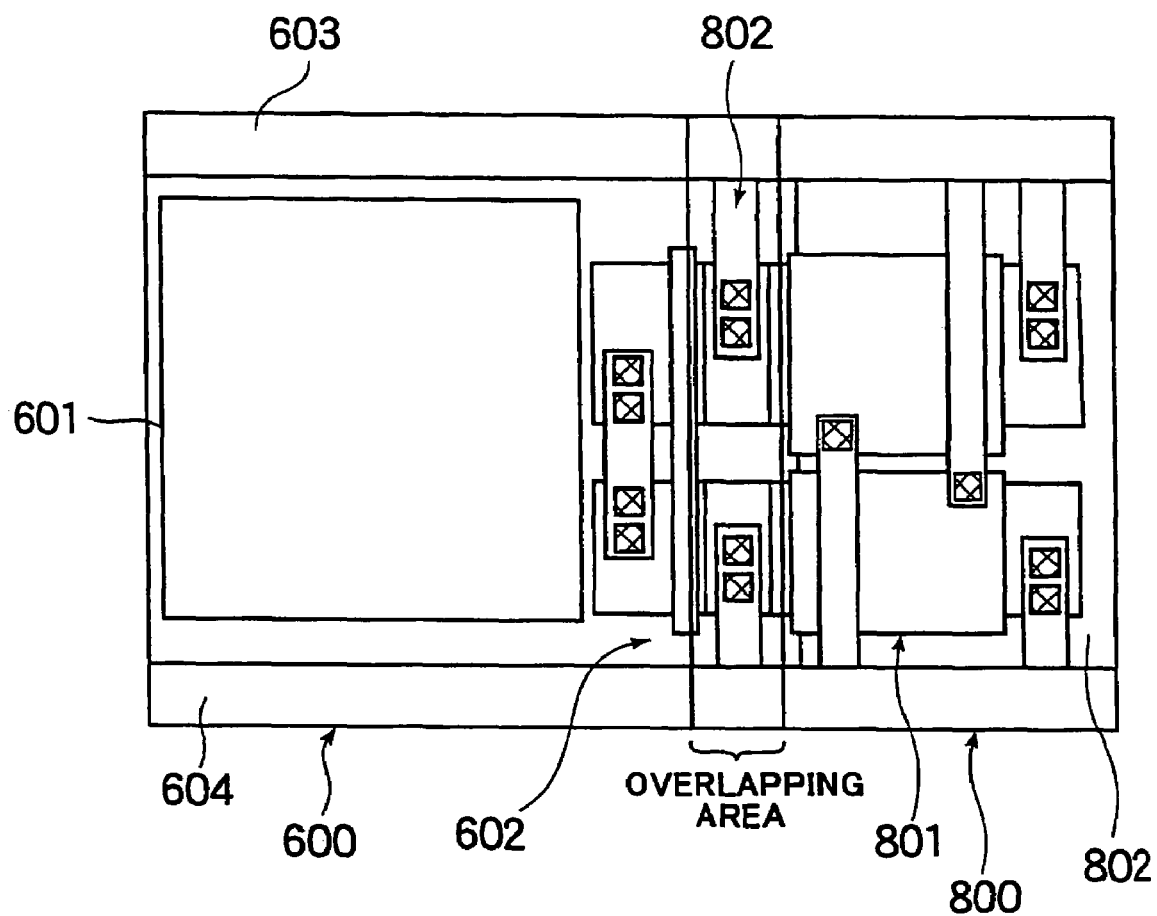
FIG. 7 is a plan view of a functional block and an on-chip capacitor overlapping each other.

For instance, a layout of the power-source terminal 802 of the on-chip capacitor 800 illustrated in FIG. 5 is coincide with a layout of the output inverter 602 of the functional block 600 illustrated in FIG. 3. Accordingly, as illustrated in FIG. 7, it is possible to overlap the power-source terminal 802 of the on-chip capacitor 800 and the output inverter 602 of the functional block 600 each other.

Furthermore, if a layout of a via-hole of the power-source terminal 802 is coincide with a layout of a via-hole of the output inverter 602, those via-holes may be electrically connected to each other.

If layouts of the power-source terminals 802 of two on-chip capacitors are coincide with each other, it is possible to overlap those two on-chip capacitors.

As described above, in the first embodiment, a layout of an output inverter of a functional block having a library stored in the overlapped-element library database 102 and a layout of a power-source terminal of an on-chip capacitor having a library stored in the overlapped-element library database 102 are standardized into several layouts. As a result, if an output inverter and a power-source terminal have a common layout, or if two power-source terminals have a common layout, it would be possible to overlap the output inverter and the power-source terminal each other or overlap the power-source terminals each other.

Though a layout of the power-source terminal 802 of the on-chip capacitor 800 illustrated in FIG. 5 is coincide with a layout of the power-source terminal 802 of the on-chip capacitor 900 illustrated in FIG. 6, the overlapped-element library database 102 may store libraries of on-chip capacitors including the power-source terminals 802 having layouts different from one another.

Though a layout of the output inverter 602 of the functional block 600 illustrated in FIG. 3 is coincide with a layout of the output inverter 602 of the functional block 700 illustrated in FIG. 4, the overlapped-element library database 102 may store libraries of functional blocks including the output inverters 602 having layouts different from one another.

Hereinbelow is explained an example of conditions for an output inverter of a functional block and a power-source terminal of an on-chip capacitor to have a common layout or to be able to overlap each other, with reference to FIG. 8.

Figure 8:
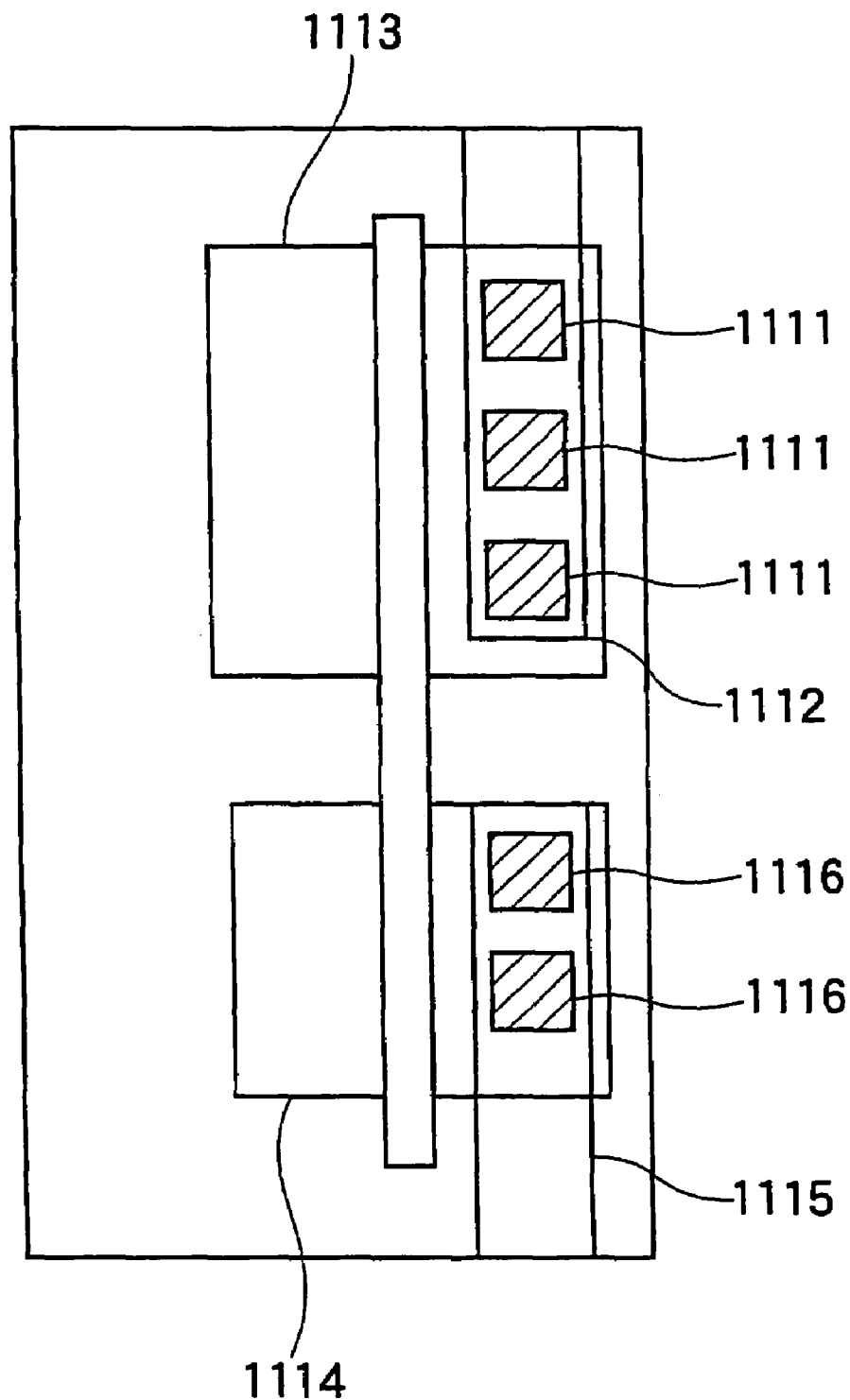
FIG. 8 is a plan view of an inverter output, used for explaining conditions for overlapping overlappable elements each other.

FIG. 8 is a plan view of an output inverter of a functional block.

An example of the conditions for an output inverter of a functional block and a power-source terminal of an on-chip capacitor to be able to overlap each other are listed hereinbelow. If all of the conditions set forth below are satisfied or minimum condition is satisfied among the conditions set forth below, it is possible to overlap an output inverter of a functional block and a power-source terminal of an on-chip capacitor each other.

(A) Via-holes 1111 and 1116 of output inverters of a functional block are coincident in both a layout and a number with via-holes of power-source terminals of an on-chip capacitor.

(B) Y-axis locations (vertical locations in FIG. 8) of source wirings 1112 and 1115 of output inverters of a functional block are coincide with y-axis locations of source wirings of power-source terminals of an on-chip capacitor.

(C) A distance between an edge of a functional block and source wirings 1112 and 1115 of output inverters of the functional block is equal to a distance between an edge of an on-chip capacitor and source wirings of power-source terminals of the on-chip capacitor.

(D) A width of the source wirings 1112 and 1115 of an output inverter of functional blocks is equal to a width of source wirings of a power-source terminal of on-chip capacitors.

(E) A Y-axis location of a p-type transistor 1113 of an output inverter of a functional block is coincident with a Y-axis location of a p-type transistor of a power-source terminal of an on-chip capacitor.

(F) A distance between an edge of a functional block and a p-type transistor 1113 of an output inverter of the functional block is equal to a distance between an edge of an on-chip capacitor and a p-type transistor of a power-source terminal of the on-chip capacitor.

(G) A Y-axis location of a n-type transistor 1114 of an output inverter of a functional block is coincident with a Y-axis location of a n-type transistor of a power-source terminal of an on-chip capacitor.

(H) A distance between an edge of a functional block and a n-type transistor 1114 of an output inverter of the functional block is equal to a distance between an edge of an on-chip capacitor and a n-type transistor of a power-source terminal of the on-chip capacitor.

Conditions for power-source terminals of two on-chip capacitors to overlap each other are identical with the above-mentioned conditions (A) to (H).

Specifically, if all of the conditions (I) to (P) mentioned below are satisfied or if minimum condition among the conditions (I) to (P) is satisfied, it would be possible to overlap power-source terminals of two on-chip capacitors each other.

(I) Via-holes of power-source terminals of the two on-chip capacitors are equal in a layout and in a number to each other.

(J) Y-axis locations of source wirings in power-source terminals of the two on-chip capacitors are coincident with each other.

(K) Distances between edges of the two on-chip capacitors and source wirings of power-source terminals of the two on-chip capacitors are equal to each other.

(L) Widths of source wirings of power-source terminals of the two on-chip capacitors are equal to each other.

(M) Y-axis locations of p-type transistors in power-source terminals of the two on-chip capacitors are coincident with each other.

(N) Distances between edges of the two on-chip capacitors and p-type transistors of power-source terminals of the two on-chip capacitors are equal to each other.

(O) Y-axis locations of n-type transistors in power-source terminals of the two on-chip capacitors are coincident with each other.

(P) Distances between edges of the two on-chip capacitors and n-type transistors of power-source terminals of the two on-chip capacitors are equal to each other.

Apart from the above-mentioned conditions, source wirings of a functional block and an on-chip capacitor are necessary to be disposed close to edges of them, that is, to face outwardly.

Functional blocks are grouped into several groups in accordance with a layout of an output inverter of them, and are stored in the overlapped-element library database 102.

The overlapped-element library database 102 further stores power-supply terminals having layouts which are equal in number to layouts of the output inverters and which are coincident with layouts of the output inverters.

The overlapped-element library database 102 stores libraries of on-chip capacitors having sizes different from one another for each of the layouts of the on-chip capacitors.

For simplification, the output inverters 602 of the functional blocks having libraries stored in the overlapped-element library database 102 and the power-supply terminals 802 of the on-chip capacitors having libraries stored in the overlapped-element library database 102 are referred to as "overlappable elements" hereinbelow.

The overlapping-action library database 104 stores such an overlapping-action library as illustrated in FIG. 9.

As illustrated in FIG. 9, the overlapping-action library includes four columns, "name of element", "priority of element", "layout of overlappable element", and "type of overlappable element".

In the column "name of element", a list of elements (a functional block and an on-chip capacitor both having an overlappable element) which can be overlapped another element is written.

In the column "priority of element", a priority assigned to the functional blocks and the on-chip capacitors indicated in the list indicated in the column "name of element" is written.

A functional block which is preferable to be disposed in the vicinity of a greater number of on-chip capacitors is designed to have a higher priority.

In the column "layout of overlappable element", a layout for each of the functional blocks and the on-chip capacitors indicated in the list indicated in the column "name of element" is written.

In the column "type of overlappable element", a type of each of the functional blocks and the on-chip capacitors indicated in the list indicated in the column "name of element" is written. Herein, if both of a functional block and an on-chip capacitor had a common type, it would be possible to overlap them. Similarly, if two on-chip capacitors had a common type, it would be possible to overlap them. Specifically, if both of a functional block and an on-chip capacitor commonly had a first or second type, it would be possible to overlap them. If two on-chip capacitors commonly had a first or second type, it would be possible to overlap them.

The other libraries database 103 stores libraries of functional blocks and fill-cells other than functional blocks and fill-cells having libraries stored in the overlapped-element library database 102. That is, the other libraries database 103 stores libraries used for designing a conventional layout of functional blocks and fill-cells.

The layout-data database 105 stores layout data relating to functional blocks, on-chip capacitors and fill-cells which have been already placed. The layout data stored in the layout-data database 105 is used later for routing (electrically connecting functional blocks with one another through wires) in designing LSI. Since routing is not relevant to the present invention, it is not explained.

Figure 10:
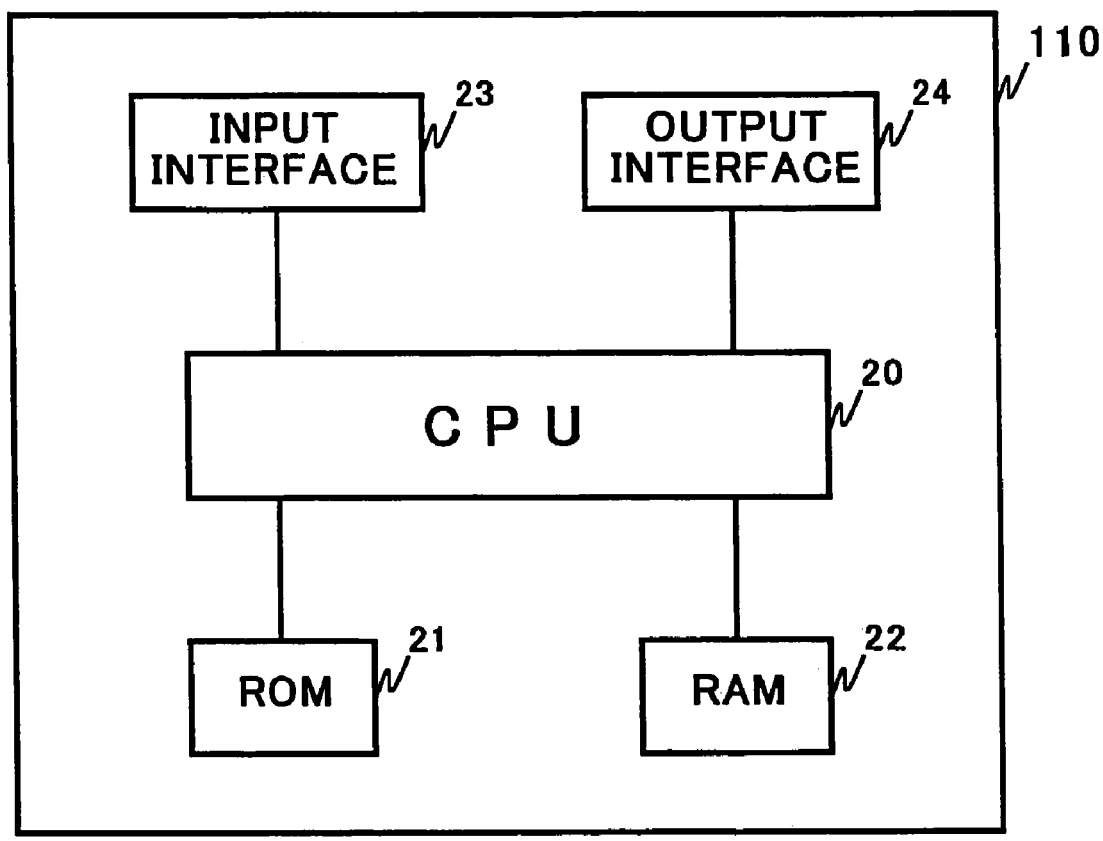
FIG. 10 is a block diagram of an example of a structure of the controller in the first embodiment.

FIG. 10 is a block diagram of an example of a structure of the controller 110.

As illustrated in FIG. 10, the controller 110 is comprised of a central processing unit 20, a first memory 21, a second memory 22, an input interface 23 through which a command and/or data is input into the central processing unit 20, and an output interface 24 through which a result of steps having been executed by the central processing unit 20 is output.

Each of the first and second memories 21 and 22 is comprised of a semiconductor memory such as a read only memory (ROM), a random access memory (RAM) or an IC memory card, or a storage device such as a flexible disc, a hard disc or an optic magnetic disc.

The first memory 21 in the first embodiment is comprised of ROM, and stores therein a program for causing a computer to carry out a method of designing a layout of a functional block and an on-chip capacitor in a semiconductor integrated circuit. The second memory 22 in the first embodiment is comprised of RAM, stores therein various data and parameters, and presents a working area to the central processing unit 20. The central processing unit 20 reads the program out of the first memory 21, and executes the program. Thus, the central processing unit 20 operates in accordance with the program stored in the first memory 21.

The controller 110 acts as a net-list input 111, a placer 112, an on-chip capacitor creator 113, a functional-block replacer 114, an overlapper 115, an on-chip capacitor replacer 116, an on-chip capacitor merger 117, a fill-cell placer 118, and a layout-data output 119.

The net-list input 111 takes a net list out of the net-list database 101 stored in the memory 100.

The placer 112 arranges or places functional blocks indicated in the net list such that a delay among the functional blocks and concentration of wires are optimized, in accordance with data indicative of electrical connection among the functional blocks, stored in the net list received from the net-list database 101 through the net-list input 111.

The on-chip capacitor creator 113 creates an on-chip capacitor to be placed in an area which remains vacant even after the functional blocks have been placed by the placer 112.

The functional-block replacer 114, among the functional blocks having been placed by the placer 112, sorts or rearranges functional blocks arranged in a common row, in an ascending order in accordance with a priority indicated in the overlapping-action library illustrated in FIG. 9. That is, the functional-block replacer 114 sorts functional blocks in accordance with a priority thereof in each of rows. Herein, "sorting functional blocks" does not mean sorting functional blocks to change a layout of functional blocks, but means sorting functional blocks to determine an order in accordance with which functional blocks are dealt with.

The overlapper 115 causes each of functional blocks to overlap an on-chip capacitor disposed adjacent to the each of functional blocks, in accordance with an order of the functional blocks having been sorted by the functional-block replacer 114.

The on-chip replacer 116, if there exists a library of an on-chip capacitor having a size equal to a sum of a size of an on-chip capacitor having been overlapped by the overlapper 115 and a size of an vacant area caused by overlapping overlappable elements each other by the overlapper 115, replaces the on-chip capacitor having been overlapped by the overlapper 115 with an on-chip capacitor having a size equal to the above-mentioned sum.

The on-chip capacitor merger 117, if two on-chip capacitors are disposed adjacent to each other, either replaces these two on-chip capacitors with a single on-chip capacitor having a size equal to a sum of sizes of the two on-chip capacitors or places an on-chip capacitor overlapping both the two on-chip capacitors.

The fill-cell placer 118 places a fill-cell in a vacant area.

The layout-data output 119 stores layout data into the layout-data database 105.

Figure 11:
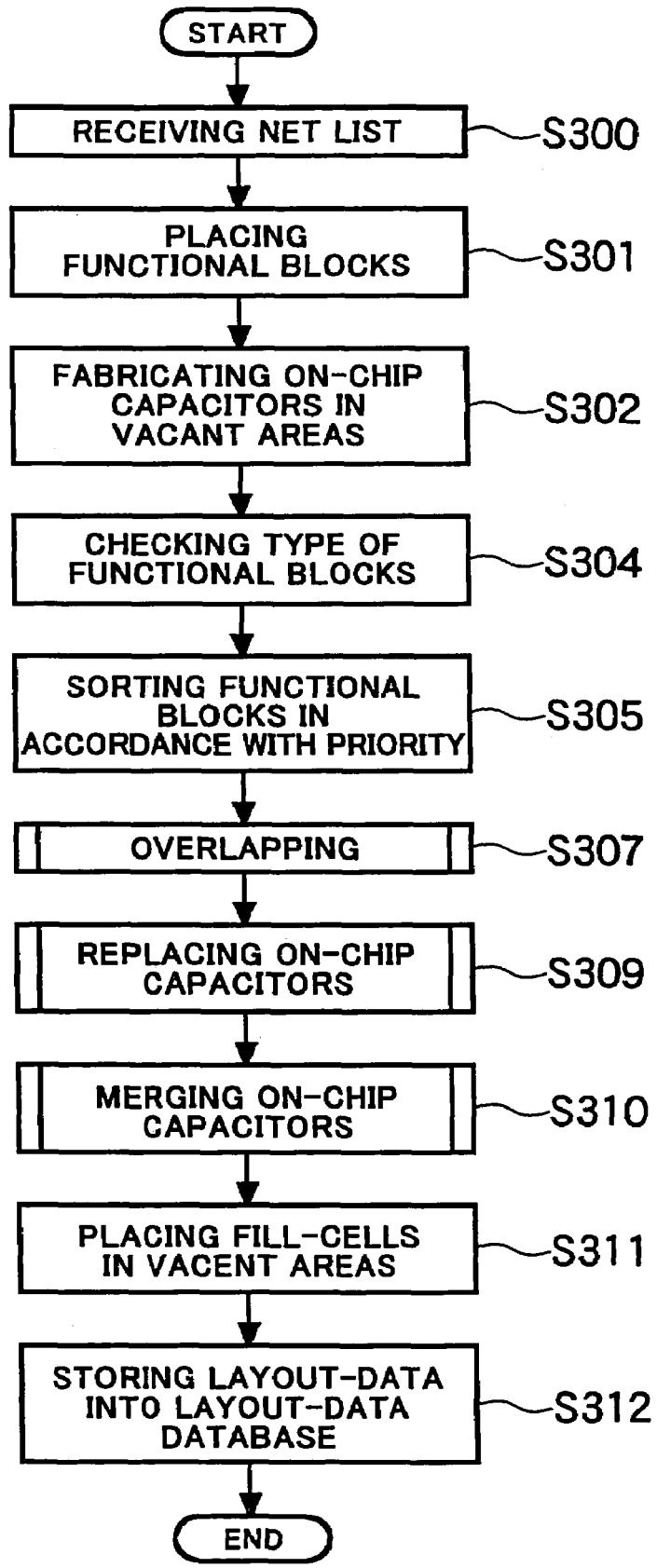
FIG. 11 is a flow chart showing steps to be carried out by the apparatus in accordance with the first embodiment of the present invention.

FIG. 11 is a flow chart showing steps to be carried out by the apparatus 1 to place functional blocks and on-chip capacitors.

Hereinbelow is explained the operation of the apparatus 1 with reference to FIG. 11.

First, the controller 110 acts as the net-list input 111 to receive a net list from the net-list database 101, in step S300.

Then, the controller 110 acts as the placer 112 to place functional blocks indicated in the net list in a semiconductor integrated circuit, in step S301.

Then, the controller 110 acts as the on-chip capacitor creator 113 to fabricate on-chip capacitors in areas which remain vacant after the functional blocks have been placed in step S301, in step S302. The on-chip capacitor creator 113 fabricates on-chip capacitors in an order of a size. That is, the on-chip capacitor creator 113 first fabricates a biggest on-chip capacitor, and finally fabricates a smallest on-chip capacitor.

Then, the controller 110 acts as the functional-block replacer 114 to check a type of the functional blocks having been placed in step S301, for each of the rows, in step S304, and sort the functional blocks in an order of a priority assigned to the functional blocks with reference to the overlapping-action library database 104, for each of the rows, in step S305.

Then, the controller 110 acting as the functional-block replacer 114 determines a row as a target row to be first dealt with, and determines a functional block having a highest priority among functional blocks included in the target row, as a target functional block to be first dealt with.

Then, the controller 110 acts as the overlapper 115 to carry out overlapping in step S307, and further, acts as the on-chip capacitor replacer 116 to carry out replacement of on-chip capacitors in step S309 in an order of sorting the functional blocks in step S305.

Specifically, a functional block having a higher priority is caused to overlap another element more early than a functional block having a lower priority in step S307. Similarly, an on-chip capacitor having a higher priority is caused to be replaced with another on-chip capacitor more early than an on-chip capacitor having a lower priority in step S309.

Then, the controller 110 acts as the on-chip capacitor merger 117 to carry out merging of on-chip capacitors, in step S310.

Then, the controller 110 acts as the fill-cell placer 118 to, if any areas remain vacant even after the step S310 has been carried out, place fill-cells in the vacant areas, in step S311.

Thus, there is created layout data.

Then, the controller 110 acts as the layout-data output 119 to store the layout data into the layout-data database 105, in step S312.

Figure 12:
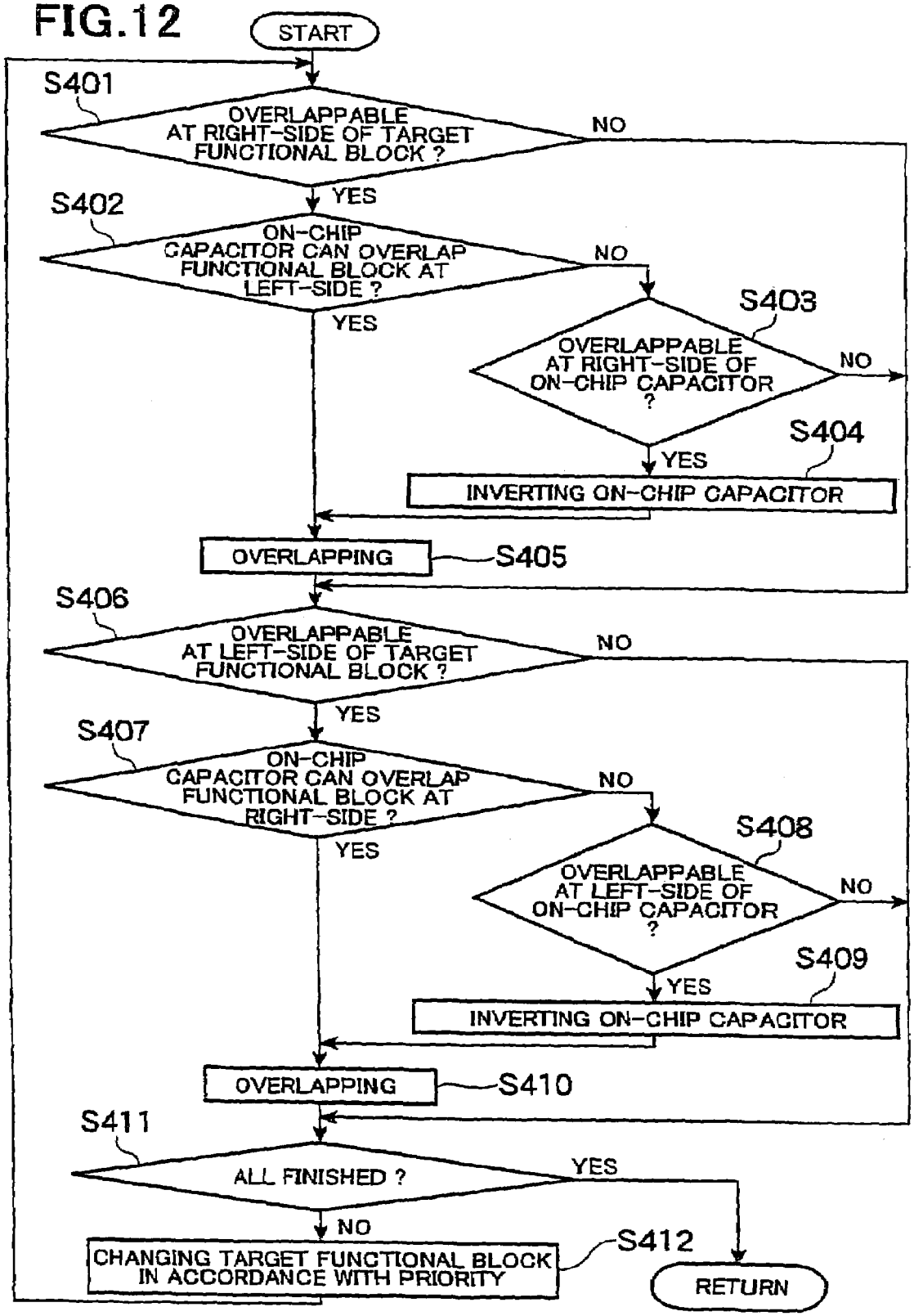
FIG. 12 is a flow chart showing steps to be carried out in the overlapping step shown in FIG. 11.

FIG. 12 is a flow chart showing steps to be carried out in step S307.

Hereinbelow is explained in detail the overlapping carried out in step S307, with reference to FIG. 12.

In the overlapping step (step S307 in FIG. 11), it is judged whether it is possible to overlap a right-side portion of the target functional block and another element each other, in step S401 In other words, it is judged whether the target functional block includes an overlappable element at the right of the functional portion 601, in step S401.

If overlappable (YES in step S401), it is further judged whether it is possible to overlap the target functional block and a left-side portion of an on-chip capacitor disposed at the right of the target functional block each other, in step S402. Specifically, it is judged in step S402 whether an on-chip capacitor is disposed at the right of the target functional block, and further, whether a left-side portion of the on-chip capacitor comprises an overlappable element which is able to overlap an overlappable element of the target functional block.

If overlappable (YES in step S402), the on-chip capacitor disposed at the right of the target functional block is caused to overlap the target functional block at the left-side portion thereof, in step S405.

For instance, the on-chip capacitor disposed at the right of the target functional block is shifted to the left by a distance equal to a width of the overlappable element. As a result, a vacant area having a width equal to a width of the overlappable element is newly formed at the right of the on-chip capacitor.

If it is not possible to overlap the target functional block and a left-side portion of the on-chip capacitor disposed at the right of the target functional block each other (NO in step S402), a right-side portion of the on-chip capacitor disposed at the right of the target functional block is checked, in step S403. Specifically, it is judged whether a right-side portion of the on-chip capacitor comprises an overlappable element which is able to overlap a right-side portion of the target functional block, and further, whether the right-side portion of the on-chip capacitor is not yet used, that is, does not yet overlap any other element.

If the a right-side portion of the on-chip capacitor comprises an overlappable element which is able to overlap a right-side portion of the target functional block, and the right-side portion of the on-chip capacitor is not yet used (YES in step S403), the on-chip capacitor is inverted symmetrically with respect to right and left, in step S404. By symmetrically turning the on-chip capacitor disposed at the right of the target functional block, it would be possible to overlap the on-chip capacitor and the target functional block each other.

Then, the on-chip capacitor is caused to overlap the target functional block, in step S405.

Following the step S405, steps S406 to S410 are carried out. If it is judged not possible to overlap a right-side portion of the target functional block and another element each other (No in step S401), steps S406 to S410 are carried out. If the a right-side portion of the on-chip capacitor does not comprise an overlappable element which is able to overlap a right-side portion of the target functional block, or if the right-side portion of the on-chip capacitor has been already used (NO in step S403), steps S406 to S410 are carried out.

In the steps S406 to S410, the procedure carried out to a right-side portion of the target functional block in the steps S401 to S405 is further carried out to a left-side portion of the target functional block.

First, it is judged whether it is possible to overlap a left-side portion of the target functional block and another element each other, in step S406 In other words, it is judged whether the target functional block includes an overlappable element at the left of the functional portion 601, in step S406.

If overlappable (YES in step S406), it is further judged whether it is possible to overlap the target functional block and a right-side portion of an on-chip capacitor disposed at the left of the target functional block each other, in step S407. Specifically, it is judged in step S407 whether an on-chip capacitor is disposed at the left of the target functional block, and further, whether a right-side portion of the on-chip capacitor comprises an overlappable element which is able to overlap an overlappable element of the target functional block.

If overlappable (YES in step S407), the on-chip capacitor disposed at the left of the target functional block is caused to overlap the target functional block at the right-side portion thereof, in step S410.

For instance, the on-chip capacitor disposed at the left of the target functional block is shifted to the right by a distance equal to a width of the overlappable element. As a result, a vacant area having a width equal to a width of the overlappable element is newly formed at the left of the on-chip capacitor.

If it is not possible to overlap the target functional block and a right-side portion of the on-chip capacitor disposed at the left of the target functional block each other (NO in step S407), a left-side portion of the on-chip capacitor disposed at the left of the target functional block is checked, in step S408. Specifically, it is judged whether a left-side portion of the on-chip capacitor comprises an overlappable element which is able to overlap a left-side portion of the target functional block, and further, whether the left-side portion of the on-chip capacitor is not yet used, that is, does not yet overlap any other element.

If the a left-side portion of the on-chip capacitor comprises an overlappable element which is able to overlap a left-side portion of the target functional block, and the left-side portion of the on-chip capacitor is not yet used (YES in step S408), the on-chip capacitor is inverted horizontally symmetrically with respect to right and left, in step S409. By symmetrically turning the on-chip capacitor disposed at the right of the target functional block, it would be possible to overlap the on-chip capacitor and the target functional block each other.

Then, the on-chip capacitor is caused to overlap the target functional block, in step S410.

Following the step S410, step S411 is carried out. If it is judged not possible to overlap a left-side portion of the target functional block and another element each other (No in step S406), step S411 is carried out. If the a left-side portion of the on-chip capacitor does not comprise an overlappable element which is able to overlap a left-side portion of the target functional block, or if the left-side portion of the on-chip capacitor has been already used (NO in step S408), step S411 is carried out.

In the step S411, it is judged whether the above-mentioned steps S401 to S410 have been carried out to all of the functional blocks.

If not (NO in step S411), a target functional block is changed to a next target functional block in accordance with a priority assigned to the functional blocks, in step S412.

Following the step S412, the steps S401 to S411 are carried out to the next target functional block.

If the steps S401 to S410 have been carried out to all of the functional blocks (YES in step S411), the overlapping step illustrated in FIG. 12 ends. Thereafter, the step S309 for replacing on-chip capacitors and the subsequent steps in FIG. 11 are carried out.

Figure 13:
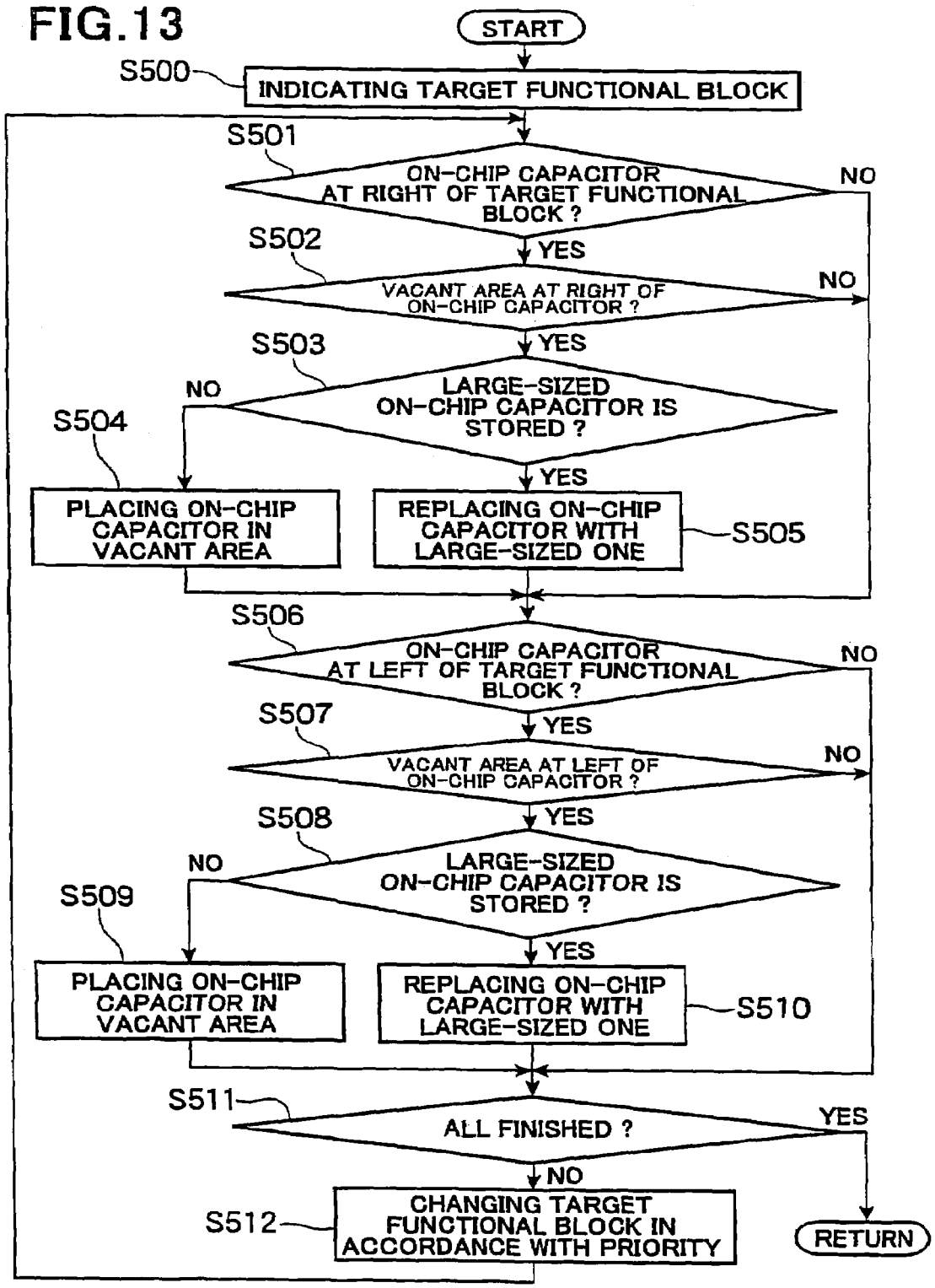
FIG. 13 is a flow chart showing steps to be carried out in the on-chip capacitor replacing step shown in FIG. 11.

FIG. 13 is a flow chart showing steps to be carried out in the step S309 for replacing on-chip capacitors.

Hereinbelow is explained in detail the step S309 with reference to FIG. 13.

First, a functional block indicated as the first target functional block in the step S305 is indicated again as a target functional block, in step S500.

Then, it is judged whether an on-chip capacitor is disposed at the right of the target functional block, in step S501.

If an on-chip capacitor is disposed at the right of the target functional block (YES in step S501), it is further judged whether a vacant area exists at the right of the on-chip capacitor, in step S502.

If a vacant area exists at the right of the on-chip capacitor (YES in step S502), that is, if the target functional block, the on-chip capacitor and the vacant area exist in a left-to-right direction, it is further judged whether the overlapped-element library database 102 stores a library of an on-chip capacitor having a size equal to a sum of a size of the on-chip capacitor disposed at the right of the target functional block and a size of the vacant area, in step S503.

If such an on-chip capacitor is stored in the overlapped-element library database 102 (YES in step S503), the on-chip capacitor disposed at the right of the target functional block is replaced with the on-chip capacitor having a size equal to a sum of a size of the on-chip capacitor disposed at the right of the target functional block and a size of the vacant area, in step S505.

If the on-chip capacitor having a size equal to a sum of a size of the on-chip capacitor disposed at the right of the target functional block and a size of the vacant area is not stored in the overlapped-element library database 102 (NO in step S503), an on-chip capacitor having a size equal to a size of the vacant area is placed in the vacant area such that the on-chip capacitor overlaps the on-chip capacitor disposed at the right of the target functional block, in step S504.

Following the steps S504 and S505, steps S506 to S510 are carried out. If an on-chip capacitor is not disposed at the right of the target functional block (NO in step S501), or if a vacant area does not exist at the right of the on-chip capacitor (NO in step S502), the steps S506 to S510 are carried out.

In the steps S506 to S510, the procedure carried out to a right-side portion of the target functional block in the steps S501 to S505 is further carried out to a left-side portion of the target functional block.

First, it is judged whether an on-chip capacitor is disposed at the left of the target functional block, in step S506.

If an on-chip capacitor is disposed at the left of the target functional block (YES in step S506), it is further judged whether a vacant area exists at the left of the on-chip capacitor, in step S507.

If a vacant area exists at the left of the on-chip capacitor (YES in step S507), that is, if the target functional block, the on-chip capacitor and the vacant area exist in a right-to-left direction, it is further judged whether the overlapped-element library database 102 stores a library of an on-chip capacitor having a size equal to a sum of a size of the on-chip capacitor disposed at the left of the target functional block and a size of the vacant area, in step S508.

If such an on-chip capacitor is stored in the overlapped-element library database 102 (YES in step S508), the on-chip capacitor disposed at the left of the target functional block is replaced with the on-chip capacitor having a size equal to a sum of a size of the on-chip capacitor disposed at the left of the target functional block and a size of the vacant area, in step S510.

If the on-chip capacitor having a size equal to a sum of a size of the on-chip capacitor disposed at the left of the target functional block and a size of the vacant area is not stored in the overlapped-element library database 102 (NO in step S508), an on-chip capacitor having a size equal to a size of the vacant area is placed in the vacant area such that the on-chip capacitor overlaps the on-chip capacitor disposed at the left of the target functional block, in step S509.

Following the steps S509 and S510, a step S511 is carried out. If an on-chip capacitor is not disposed at the left of the target functional block (NO in step S506), or if a vacant area does not exist at the right of the on-chip capacitor (NO in step S507), the step S511 is carried out.

In the step S511, it is judged whether the above-mentioned steps S501 to S510 have been carried out to all of the functional blocks.

If not (NO in step S511), a target functional block is changed to a next target functional block in accordance with a priority assigned to the functional blocks, in step S512.

Specifically, if a certain functional block has a priority next to a priority of the current target functional block among functional blocks included in the target row, the certain functional block is newly indicated as a target functional block. If the above-mentioned steps S501 to S510 have been already carried out to all of functional blocks included in the target row, a functional block having a highest priority among functional blocks included in a next target row is newly indicated as a target functional block.

Following the step S512, the steps S501 to S511 are carried out to a functional block having been newly indicated as a target functional block.

If the steps S501 to S510 have been carried out to all of the functional blocks, that is, the functional blocks included in all of the rows (YES in step S511), the step for replacing an on-chip capacitor, illustrated in FIG. 13 ends. Thereafter, the step S310 for merging on-chip capacitors and the subsequent steps in FIG. 11 are carried out.

Figure 14:
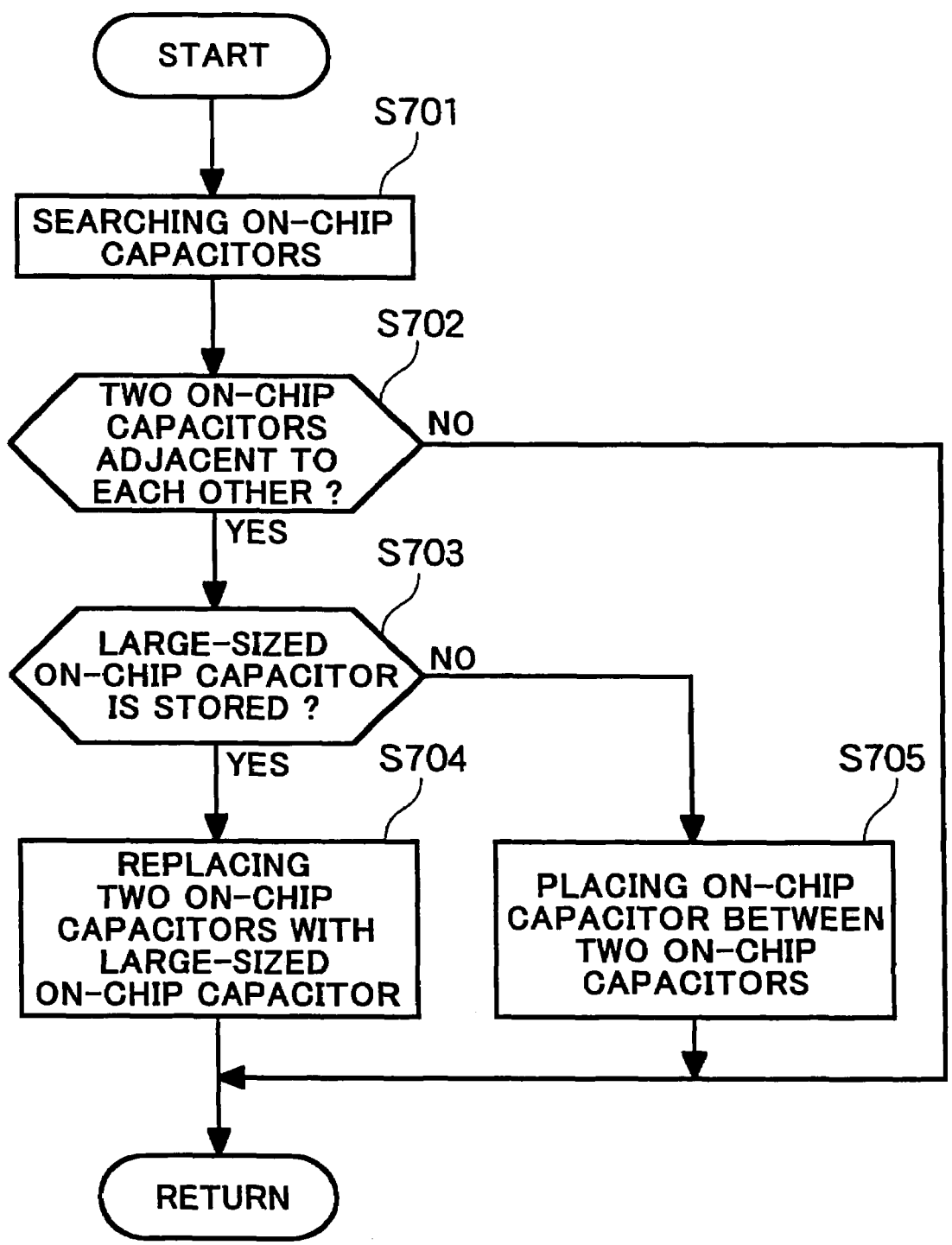
FIG. 14 is a flow chart showing steps to be carried out in the on-chip capacitor merging step shown in FIG. 11.

FIG. 14 is a flow chart showing steps to be carried out in the step S310 for merging on-chip capacitors.

Hereinbelow is explained in detail the step S310 with reference to FIG. 14.

First, all of on-chip capacitors mounted on a chip are searched in step S701 to find a layout in which on-chip capacitors are disposed adjacent to each other, in step S702.

If a layout in which two on-chip capacitors are disposed adjacent to each other is found (YES in step S702), it is judged whether the overlapped-element library database 102 stores a library of an on-chip capacitor having a size equal to a sum of sizes of the two on-chip capacitors, in step S703.

If the overlapped-element library database 102 stores a library of an on-chip capacitor having a size equal to a sum of sizes of the two on-chip capacitors (YES in step S703), the two on-chip capacitors are replaced with a single on-chip capacitor having a size equal to a sum of sizes of the two on-chip capacitors, in step S704.

If the overlapped-element library database 102 does not store a library of an on-chip capacitor having a size equal to a sum of sizes of the two on-chip capacitors (NO in step S703), an on-chip capacitor is placed between the two on-chip capacitors such that the on-chip capacitor overlaps the two on-chip capacitors, in step S705.

The above-mentioned steps S703 to S705 are carried out at a time to all of on-chip capacitors mounted on a chip. That is, if there exists in a chip a plurality of layouts in which two on-chip capacitors are disposed adjacent to each other, the steps S703 and S704 or the steps S703 and S705 are carried out to the plurality of layouts.

Following the step S704 or S705, or if a layout in which two on-chip capacitors are disposed adjacent to each other is not found (NO in step S702), the step of merging on-chip capacitors is finished. Then the steps S311 and the subsequent steps in FIG. 11 are carried out.

FIGS. 15 to 18 are plan views illustrating how a layout of functional blocks and on-chip capacitors in a chip varies in accordance with the steps shown in FIG. 11. For simplification, FIGS. 15 to 18 illustrate only one row of functional blocks in a chip.

Figure 15:
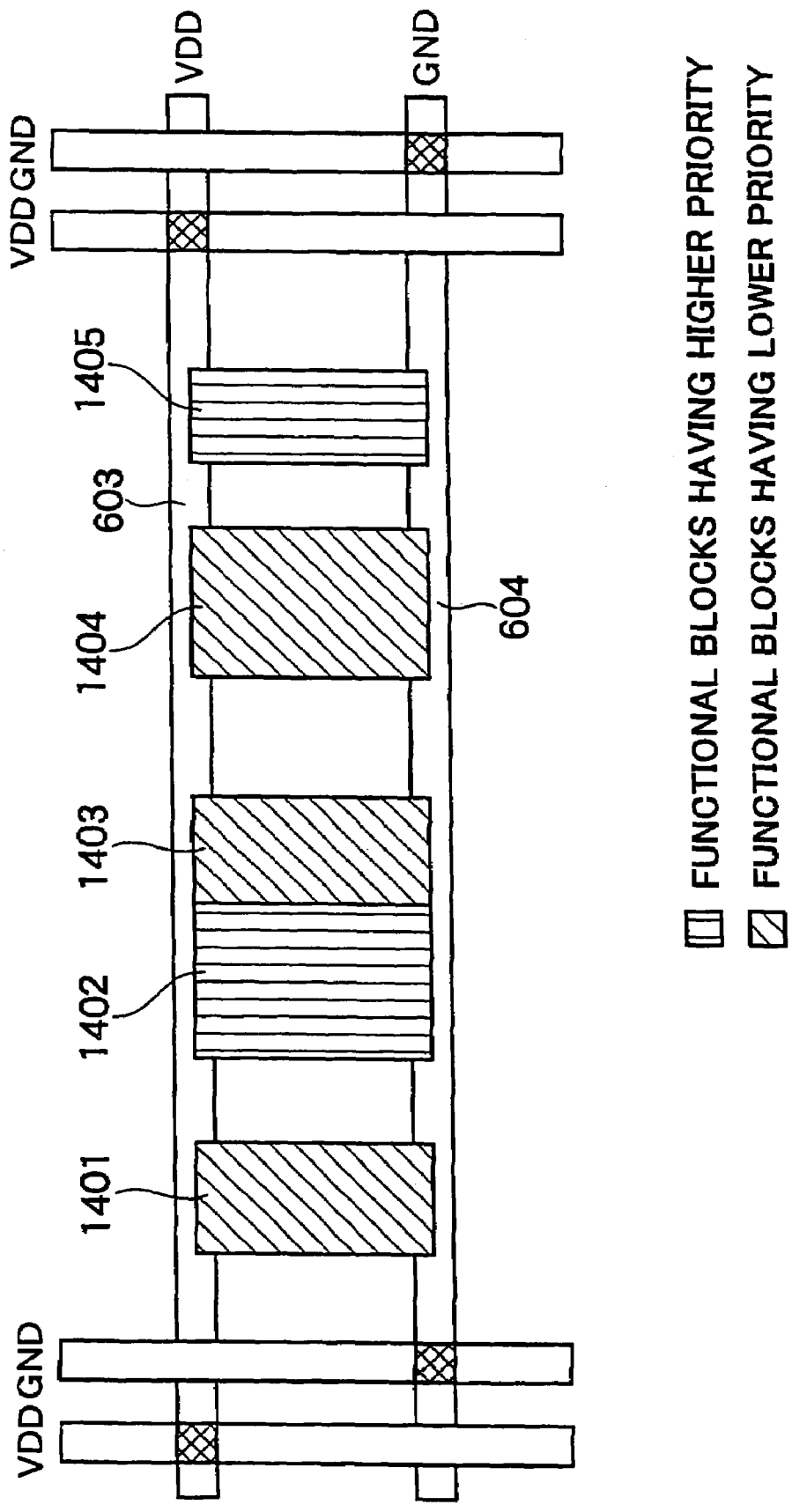
FIG. 15 is a plan view illustrating how a layout of functional blocks and on-chip capacitors in a chip varies in accordance with the steps shown in FIG. 11.

At the time when the step S301 for placing functional blocks has been finished, as illustrated in FIG. 15, functional blocks 1401, 1402, 1403, 1404 and 1405 are placed in a desired layout.

It is assumed that the functional blocks 1402 and 1405 are designed to have a higher priority than a priority of the functional blocks 1401, 1403 and 1404.

Figure 16:
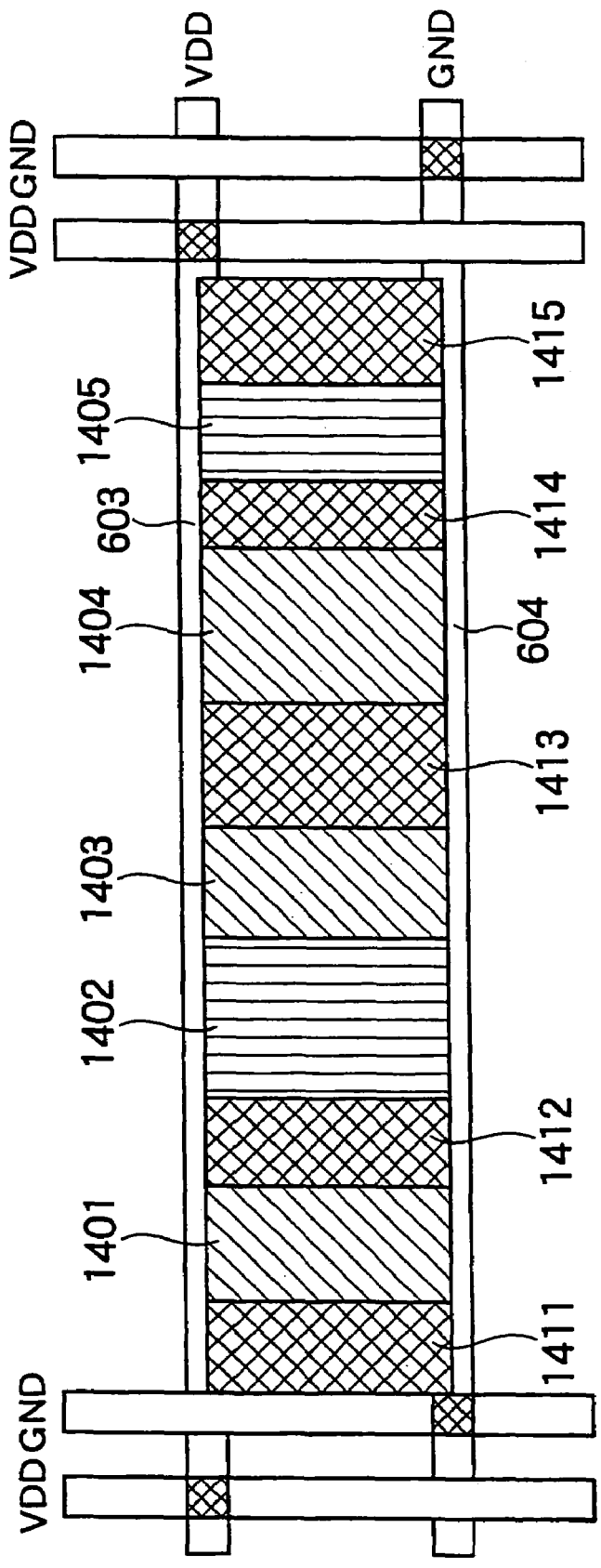
FIG. 16 is a plan view illustrating how a layout of functional blocks and on-chip capacitors in a chip varies in accordance with the steps shown in FIG. 11.

At the time when an on-chip capacitor was placed in a vacant area formed between the functional blocks having been placed in the step S301, as illustrated in FIG. 16, on-chip capacitors 1411, 1412, 1413, 1414 and 1415 are placed in vacant areas formed between the functional blocks 1401, 1402, 1403, 1404 and 1405 or in vacant area formed adjacent to the functional blocks 1401 and 1405.

Figure 17:
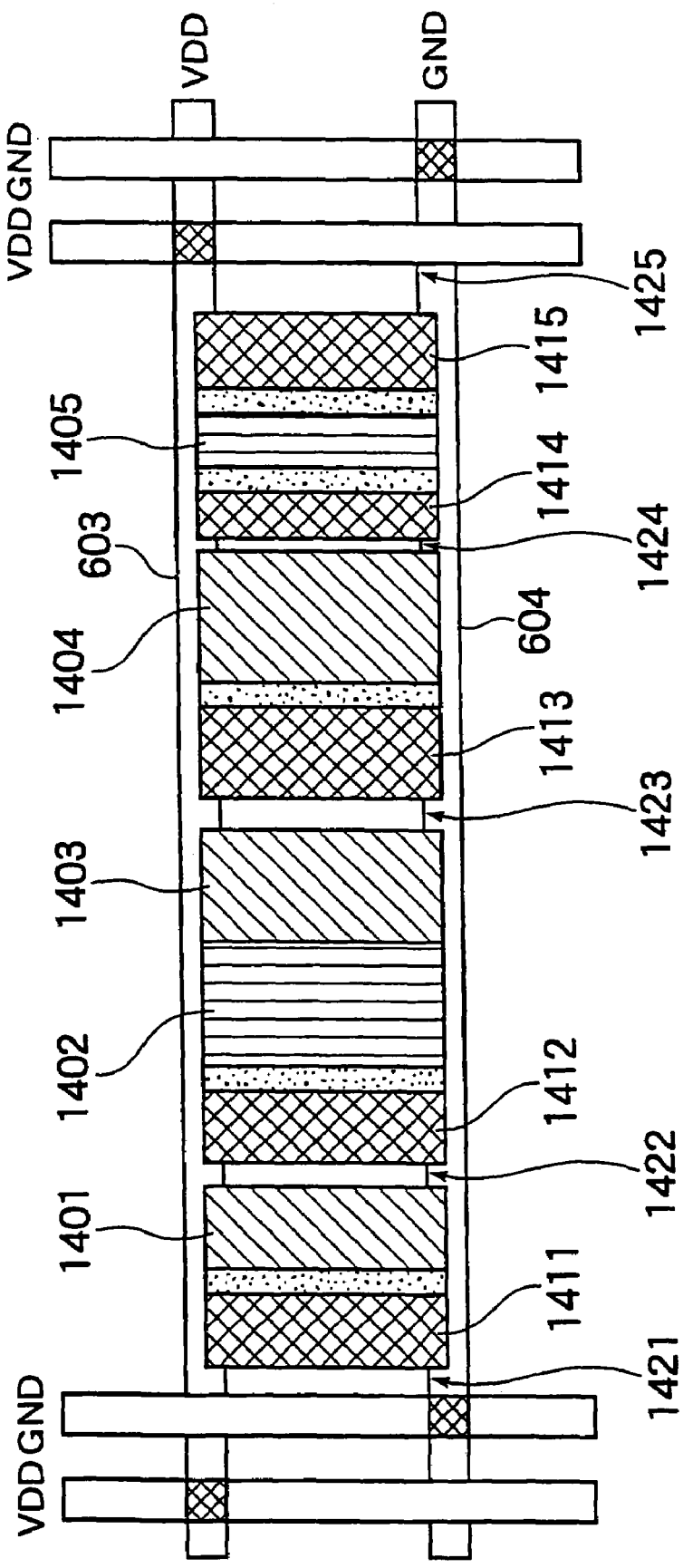
FIG. 17 is a plan view illustrating how a layout of functional blocks and on-chip capacitors in a chip varies in accordance with the steps shown in FIG. 11.

At the time when the step S307 for overlapping on-chip capacitors and functional blocks disposed adjacent to the on-chip capacitors each other, as illustrated in FIG. 17, each of the on-chip capacitors 1411, 1412, 1413, 1414 and 1415 overlaps a functional block disposed adjacent to each of the on-chip capacitors 1411, 1412, 1413 and 1414. As a result, there are formed vacant areas 1421, 1422, 1423, 1424 and 1425 adjacent to the on-chip capacitors 1411, 1412, 1413, 1414 and 1415.

As illustrated in FIG. 17, the on-chip capacitor 1412 placed between the functional block 1401 having a lower priority and the functional block 1402 having a higher priority is caused to preferentially overlap the functional block 1402 having a higher priority. Similarly, the on-chip capacitor 1414 placed between the functional block 1404 having a lower priority and the functional block 1405 having a higher priority is caused to preferentially overlap the functional block 1405 having a higher priority.

At the time when the step S310 for merging on-chip capacitors, as illustrated in FIG. 18, the on-chip capacitor 1412 is replaced with an on-chip capacitor 1431, and an on-chip capacitor 1432 is newly placed between the functional block 1403 and the on-chip capacitor 1413 such that the on-chip capacitor 1432 overlaps both of the functional block 1403 and the on-chip capacitor 1413. Furthermore, the on-chip capacitor 1414 is replaced with an on-chip capacitor 1433, and an on-chip capacitor 1434 is newly placed adjacent to the on-chip capacitor 1415 such that the on-chip capacitor 1434 overlaps the on-chip capacitor 1415.

In accordance with the above-mentioned first embodiment, a functional block and an on-chip capacitor are caused to overlap each other, if possible. As a result, there is formed a vacant area having a size equal to a size of an area in which the functional block and the on-chip capacitor overlaps each other.

Furthermore, an on-chip capacitor is placed further in such a vacant area, and hence, it is possible to increase a total volume or a total capacity of on-chip capacitors mounted in a chip beyond the prior art, ensuring reduction in electrical noises in comparison with the prior art.

Specifically, for instance, a layout of an output inverter of functional blocks and a layout of a power-source terminal of on-chip capacitors are standardized into several layouts. Thus, it would be possible to overlap an output inverter and a power-source terminal each other, or overlap power-source terminals each other. Then, an on-chip capacitor or on-chip capacitors is(are) placed in a vacant area formed as a result of overlapping an output inverter and a power-source terminal or power-source terminals each other. Accordingly, it would be possible to place on-chip capacitors in a greater number than the conventional method.

Specifically, for instance, if the overlapped-element library database 102 stores an on-chip capacitor having a size equal to a sum of a size of an on-chip capacitor disposed adjacent to a functional block and a size of a vacant area formed adjacent to the on-chip capacitor by the overlapping step, it would be possible to place an on-chip capacitor in the vacant area by replacing the on-chip capacitor disposed adjacent to the functional block with the on-chip capacitor having a size equal to the above-mentioned sum.

Even if the overlapped-element library database 102 does not store an on-chip capacitor having a size equal to a sum of a size of an on-chip capacitor disposed adjacent to a functional block and a size of a vacant area formed adjacent to the on-chip capacitor by the overlapping step, it would be possible to place an on-chip capacitor in the vacant area by designing the on-chip capacitor to have a size equal to a size of the vacant area. Furthermore, since the newly placed on-chip capacitor is placed so as to overlap the existing on-chip capacitors, it would be possible to select an on-chip capacitor having a size as large as possible.

In the step of merging on-chip capacitors, two on-chip capacitors disposed adjacent to each other are replaced with a single on-chip capacitor having a size equal to a sum of sizes of the two on-chip capacitors. Accordingly, the single on-chip capacitor is larger in size than the two on-chip capacitors by a size of an overlappable element disposed at an end of each of the two on-chip capacitors.

Even if two on-chip capacitors disposed adjacent to each other cannot be replaced with a single on-chip capacitor having a size equal to a sum of sizes of the two on-chip capacitors, in the step of merging on-chip capacitors, another on-chip capacitor is placed between the two on-chip capacitors such that the another on-chip capacitor overlaps both of the two on-chip capacitors, ensuring it possible to place a possibly great number of on-chip capacitors in a chip.

Since it is possible to place on-chip capacitors as much as possible in a chip, it is possible to suppress electrical noises which would cause problems in a semiconductor integrated circuit such as LSI.

In a conventional chip, since an on-chip capacitor is comprised of any devices such as a MOS transistor, it was not possible to fabricate an on-chip capacitor in a vacant area having a minimum width (a vacant area corresponding to one site), and accordingly, the vacant area was filled with a fill-cell.

In contrast, in the first embodiment, an on-chip capacitor is placed to overlap on-chip capacitors disposed adjacent thereto. Hence, it is possible to place an on-chip capacitor even in a vacant area having a minimum width.

Furthermore, by placing an on-chip capacitor to overlap a functional block as much as possible, a distance between the on-chip capacitor and the functional block can be shortened, avoiding problems such as deterioration in delay or malfunction.

Second Embodiment

The second embodiment in accordance with the present invention is different from the above-mentioned first embodiment only in the step S309 of replacing an on-chip capacitor with another on-chip capacitor.

Figure 19A:
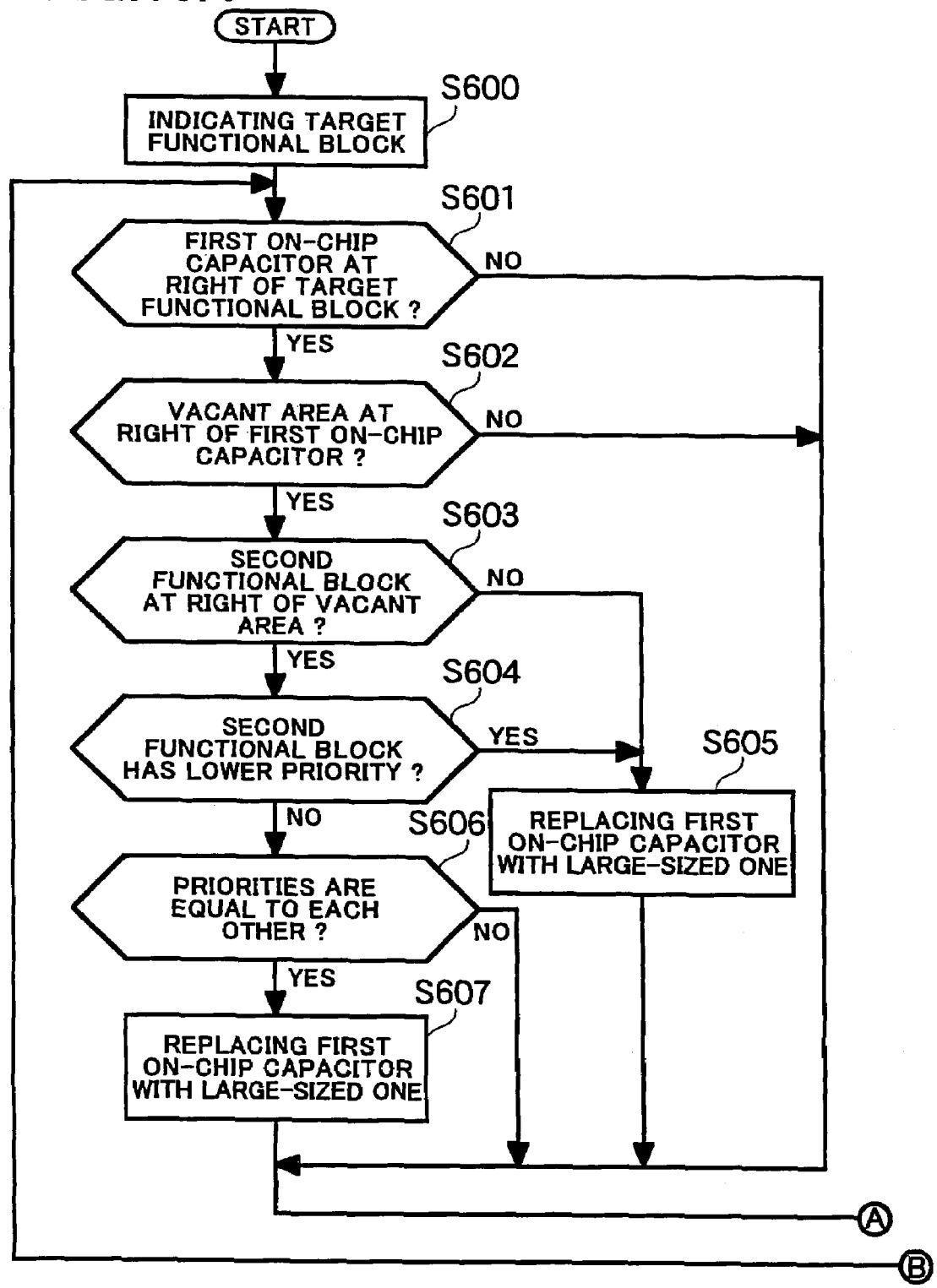
FIG. 19A is a flow chart showing steps to be carried out in the on-chip capacitor replacing step in the second embodiment.
Figure 19B:
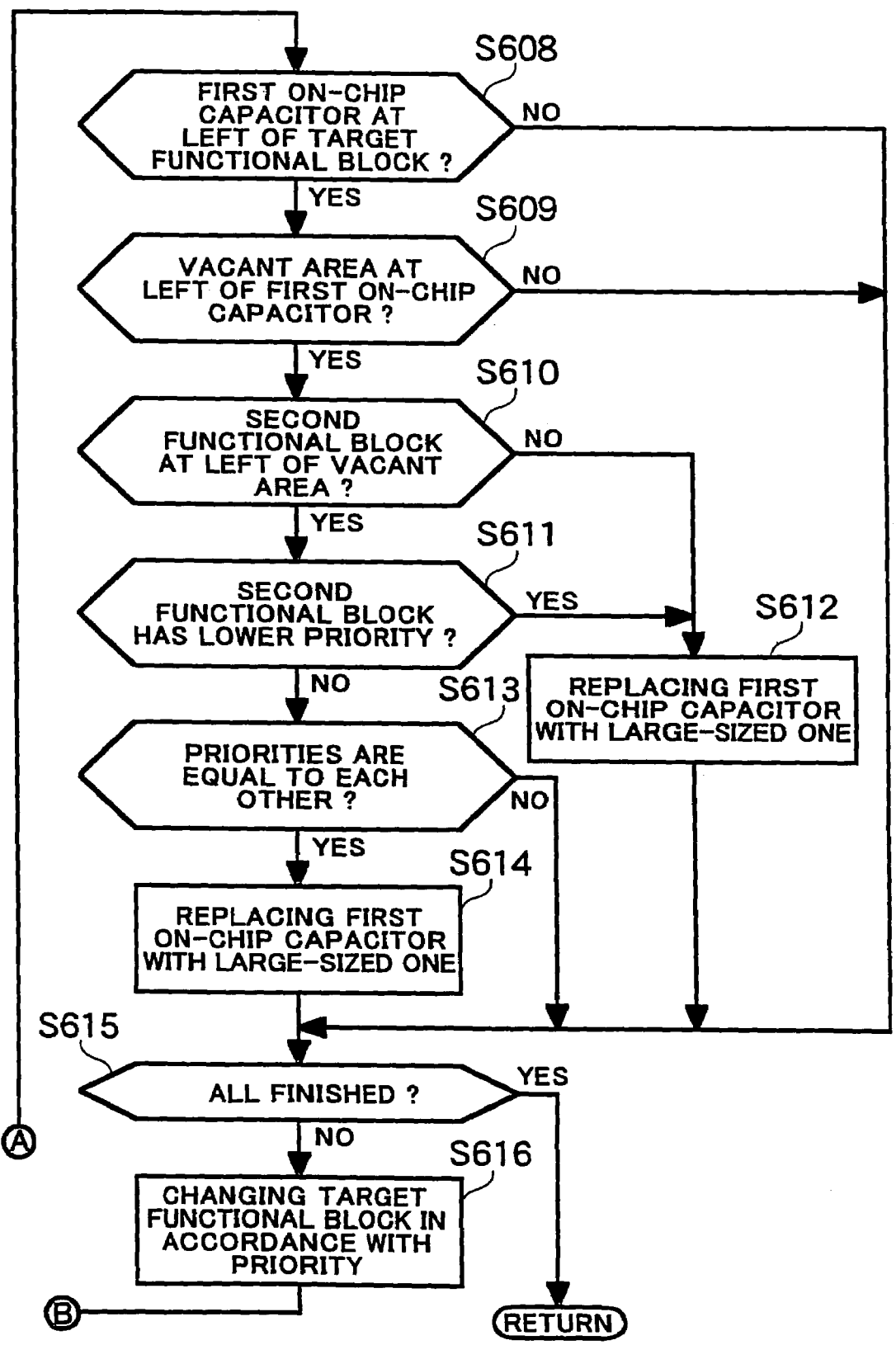
FIG. 19B is a flow chart showing steps to be carried out subsequently to the steps shown in FIG. 19A.

FIGS. 19A and 19B are flow charts showing steps to be carried out in the step S309 in the second embodiment.

Hereinbelow is explained in the step S309 of replacing an on-chip capacitor with another on-chip capacitor in the second embodiment with reference to FIGS. 19A and 19B.

First, a functional block indicated as the first target functional block in the step S305 is indicated again as a target functional block, in step S600.

Then, it is judged whether a first on-chip capacitor is disposed at the right of the target functional block, in step S601.

If a first on-chip capacitor is judged to be disposed at the right of the target functional block (YES in step S601), it is further judged whether a vacant area exists at the right of the first on-chip capacitor, in step S602.

If a vacant area is judged to exist at the right of the first on-chip capacitor (YES in step S602), that is, if the target functional block, the first on-chip capacitor and the vacant area exist in a left-to-right direction, it is further judged whether a second functional block is disposed at the right of the vacant area, in step S603.

If the second functional block is judged to be disposed at the right of the vacant area (YES in step S603), it is judged whether the second functional block has a lower priority than a priority of the target functional block, in step S604.

If the second functional block is judged to have a lower priority than a priority of the target functional block (YES in step S604), that is, if the target functional block has a higher priority than a priority of the second functional block, the first on-chip capacitor is replaced with an on-chip capacitor having a size equal to a sum of a size of the first on-chip capacitor and a size of the vacant area, in step S605.

If the second functional block is judged to have a priority not lower than a priority of the target functional block (NO in step S604), it is judged whether a priority of the second functional block is equal to a priority of the target functional block, in step S606.

If a priority of the second functional block is judged to be equal to a priority of the target functional block (YES in step S606), the first on-chip capacitor is replaced with an on-chip capacitor having a size equal to a sum of a size of the first on-chip capacitor and a half of a size of the vacant area, in step S607.

If the second functional block is judged not to be disposed at the right of the vacant area (NO in step S603), the first on-chip capacitor is replaced with an on-chip capacitor having a size equal to a sum of a size of the first on-chip capacitor and a size of the vacant area, in step S605.

Following the above-mentioned steps S605 and S607, steps S608 to S614 are carried out. Similarly, if a first on-chip capacitor is judged not to be disposed at the right of the target functional block (NO in step S601), if a vacant area is judged not to exist at the right of the first on-chip capacitor (NO in step S602), or if a priority of the second functional block is judged not to be equal to a priority of the target functional block (NO in step S606), steps S608 to S614 are carried out.

In the steps S608 to S614, the procedure having been carried out to a right-side portion of the target functional block in the above-mentioned steps S601 to S607 is carried out to a left-side portion of the target functional block.

It is judged whether a first on-chip capacitor is disposed at the left of the target functional block, in step S608.

If a first on-chip capacitor is judged to be disposed at the left of the target functional block (YES in step S608), it is further judged whether a vacant area exists at the left of the first on-chip capacitor, in step S609.

If a vacant area is judged to exist at the left of the first on-chip capacitor (YES in step S609), that is, if the target functional block, the first on-chip capacitor and the vacant area exist in a right-to-left direction, it is further judged whether a second functional block is disposed at the left of the vacant area, in step S610.

If the second functional block is judged to be disposed at the left of the vacant area (YES in step S610), it is judged whether the second functional block has a lower priority than a priority of the target functional block, in step S611.

If the second functional block is judged to have a lower priority than a priority of the target functional block (YES in step S610), that is, if the target functional block has a higher priority than a priority of the second functional block, the first on-chip capacitor is replaced with an on-chip capacitor having a size equal to a sum of a size of the first on-chip capacitor and a size of the vacant area, in step S612.

If the second functional block is judged to have a priority not lower than a priority of the target functional block (NO in step S611), it is judged whether a priority of the second functional block is equal to a priority of the target functional block, in step S613.

If a priority of the second functional block is judged to be equal to a priority of the target functional block (YES in step S613), the first on-chip capacitor is replaced with an on-chip capacitor having a size equal to a sum of a size of the first on-chip capacitor and a half of a size of the vacant area, in step S614.

If the second functional block is judged not to be disposed at the left of the vacant area (NO in step S610), the first on-chip capacitor is replaced with an on-chip capacitor having a size equal to a sum of a size of the first on-chip capacitor and a size of the vacant area, in step S612.

Following the above-mentioned steps S612 and S614, a step S615 is carried out. Similarly, if a first on-chip capacitor is judged not to be disposed at the left of the target functional block (NO in step S608), if a vacant area is judged not to exist at the left of the first on-chip capacitor (NO in step S609), or if a priority of the second functional block is judged not to be equal to a priority of the target functional block (NO in step S613), the step S615 is carried out.

In the step S615, it is judged whether the above-mentioned steps S601 to S614 have been carried out to all of the functional blocks.

If not (NO in step S615), a target functional block is changed to a next target functional block in accordance with a priority assigned to the functional blocks, in step S616.

Specifically, if a certain functional block has a priority next to a priority of the current target functional block among functional blocks included in the target row, the certain functional block is newly indicated as a target functional block. If the above-mentioned steps S601 to S614 have been already carried out to all of functional blocks included in the target row, a functional block having a highest priority among functional blocks included in a next target row is newly indicated as a target functional block.

Following the step S616, the steps S601 to S614 are carried out to the newly indicated target functional block.

When the steps S601 to S614 are carried out to all of the functional blocks, that is, the functional blocks includes in all of the rows (YES in step S615), the step S310 of merging on-chip capacitors, illustrated in FIGS. 19A and 19B, is finished. Thereafter, the step S311 of filling vacant area with fill-cells is carried out.

In accordance with the above-mentioned second embodiment, if an on-chip capacitor is disposed adjacent to a target functional block, and a vacant area is disposed adjacent to the on-chip capacitor, it is judged whether another functional block is disposed adjacent to the vacant area. If the another functional block is disposed adjacent to the vacant area, a priority of the another functional block is compared to a priority of the target functional block.

If the target functional block has a priority higher than a priority of the another functional block, the on-chip capacitor disposed adjacent to the target functional block is replaced with an on-chip capacitor having a size equal to a sum of a size of the on-chip capacitor and a size of the vacant area.

If the target functional block has a priority equal to a priority of the another functional block, the on-chip capacitor disposed adjacent to the target functional block is replaced with an on-chip capacitor having a size equal to a sum of a size of the on-chip capacitor and a half of a size of the vacant area.

In the rest of the vacant area is placed therein an on-chip capacitor disposed adjacent to a functional block in the on-chip capacitor merging step S310 (see FIG. 14) to be later carried out. That is, if the target functional block has a priority equal to a priority of another functional block disposed closet to the target functional block, the vacant area is used to place an on-chip capacitor therein to equally overlap the target and another functional blocks.

If the target functional block has a lower priority than a priority of the another functional block, the vacant area remains vacant without placing an on-chip capacitor therein.

The vacant area remaining vacant is used to place therein an on-chip capacitor disposed adjacent to a functional block in the on-chip capacitor merging step S310 (see FIG. 14) to be later carried out. That is, if the target functional block has a lower priority than a priority of another functional block disposed closest to the target functional block, the vacant area remains vacant. Hence, the vacant area is used to place therein an on-chip capacitor disposed adjacent a functional block disposed closet to the target functional block.

In the above-mentioned first and second embodiments, the requisite steps (steps S401 to S405 in FIG. 12, steps S501 to S505 in FIG. 13, and steps S601 to S607 in FIG. 19) are carried out first to a right-side portion of a target functional block, and then, the requisite steps (steps S406 to S410 in FIG. 12, steps S506 to S510 in FIG. 13, and steps S608 to S614 in FIG. 19) are carried out to a left-side portion of a target functional block in the overlapping step (step S307 in FIG. 11) and the on-chip capacitor replacing step (step S309 in FIG. 11). It should be noted that the requisite steps may be carried out first to a left-side portion of a target functional block, and subsequently to a right-side portion of a target functional block.

The on-chip capacitor merging step (step S310 in FIG. 11 and steps S701 to S705 in FIG. 14) may be omitted in the above-mentioned first and second embodiments. Even if the on-chip capacitor merging step is omitted, the advantages obtained by the first and second embodiments are not reduced.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2005-089011 filed on Mar. 25, 2005 including specification, claims, drawings and summary is incorporated herein by reference in its entirety.

What is claimed is:

1. A method of designing a layout of functional blocks and on-chip capacitors in a semiconductor integrated circuit, comprising the steps of, in sequence:
   (a) placing a functional block;
   (b) placing an on-chip capacitor in an area which remains vacant after said step (a) has been carried out;
   (c) overlapping a portion of said functional block having been placed in said step (a) and a portion of said on-chip capacitor having been placed in said step (b) with each other creating a vacant area; and
   (d) placing an on-chip capacitor in said vacant area caused by carrying out said step (c).

2. The method as set forth in claim 1, wherein said step (c) includes the steps of:
   (c1) judging, whether it is possible to overlap said functional blocks and said on-chip capacitor having been placed in said step (b) with each other based on an order of predetermined priority assigned to all of the functional blocks having been placed in said step (a); and
   (c2) overlapping said functional blocks and said on-chip capacitor with each other based on said step (c1).

3. The method as set forth in claim 1, wherein said step (d) includes the step (e) of, determining an existence of a library of a first on-chip capacitor having a size equal to a sum of a size of said on-chip capacitor having been overlapped in said step (c) and a size of said vacant area, replacing said on-chip capacitor having been overlapped in said step (c) with said first on-chip capacitor.

4. The method as set forth in claim 3, wherein said step (e) is carried out to all of the on-chip capacitors having been placed in said step (b) in an order of a priority assigned to the functional blocks placed adjacent to said on-chip capacitors.

5. The method as set forth in claim 3, wherein said step (d) includes the step (f) of, determining a nonexistence of a library of a first on-chip capacitor having a size equal to a sum of a size of said on-chip capacitor having been overlapped in said step (c) and a size of said vacant area, placing an on-chip capacitor in said vacant area, said on-chip capacitor being equal in size to said vacant area.

6. The method as set forth in claim 5, wherein said on-chip capacitor to be placed in said step (f) is placed overlapping an on-chip capacitor disposed adjacent to said on-chip capacitor.

7. The method as set forth in claim 3, further comprising the step (n) of, upon determining there exists a library of an on-chip capacitor having a size equal to a sum of sizes of two on-chip capacitors disposed adjacent to each other, replacing said two on-chip capacitors with a single on-chip capacitor having a size equal to said sum.

8. The method as set forth in claim 7, further comprising the step (o) of, upon determining there does not exist a library of an on-chip capacitor having a size equal to a sum of sizes of two on-chip capacitors disposed adjacent to each other, and there exists a vacant area between said two on-chip capacitors, placing an on-chip capacitor in said vacant area such that said on-chip capacitor overlaps said two on-chip capacitors.

9. The method as set forth in claim 1, wherein said step (d) includes the steps of:

(g) sorting all of the functional blocks having been placed in said step (a), in an order of a predetermined priority assigned to said functional blocks;

(h) successively changing a target functional block in accordance with the order resulted from said step (g);

(i) judging whether an on-chip capacitor is disposed adjacent to said target functional block, a vacant area exists adjacent to said on-chip capacitor, and another functional block is disposed adjacent to said vacant area;

(j) comparing a priority assigned to said another functional block with a priority assigned to said target on-chip capacitor, upon determining said another functional block is judged to be disposed adjacent to said vacant area; and (k) replacing said on-chip capacitor with an on-chip capacitor having a size equal to a sum of a size of said on-chip capacitor and a size of said vacant area, upon determining a priority assigned to said target on-chip capacitor is judged in said step (j) higher than a priority assigned to said another functional block.

10. The method as set forth in claim 9, wherein said step (d) includes the step (l) of, upon determining a priority assigned to said target functional block is judged in said step (j) equal to a priority assigned to said another o functional block, replacing said on-chip capacitor with an on-chip capacitor having a size equal to a sum of a size of said on-chip capacitor and a half of a size of said vacant area.

11. The method as set forth in claim 9, wherein said step (d) includes the step (m) of, upon determining a priority assigned to said another functional block is judged in said step (j) higher than a priority assigned to said target functional block, remaining said vacant area vacant.

12. The method as set forth in claim 1, further comprising the step (p) of preparing a database storing libraries of functional blocks and libraries of on-chip capacitors having different sizes from one another, wherein a layout of an output inverter of said functional blocks and a layout of a power-source terminal of said on-chip capacitors are standardized into several layouts, an output inverter and a power-source terminal associated with each other with respect to a layout can be overlapped each other, and power-source terminals associated with each other with respect to a layout can be overlapped each other.

13. A computer program stored on a computer readable medium for causing a computer to carry out a method of designing a layout of functional blocks and on-chip capacitors in a semiconductor integrated circuit, steps executed by said computer in accordance with said program including:

(a) placing a functional block;

(b) placing an on-chip capacitor in an area which is vacant after said step (a) has been carried out;

(c) overlapping a portion of said functional block having been placed in said step (a) and a portion of said on-chip capacitor having been placed in said step (b) with each other creating a vacant area; and (d) placing an on-chip capacitor in said vacant area caused by carrying out said step (c).

14. A method of fabricating a semiconductor integrated circuit including a functional block and an on-chip capacitor both formed on a substrate or an electrically insulating layer, including:

fabricating a functional block and an on-chip capacitor on a substrate or an electrically insulating layer in accordance with a layout which is determined by the steps of:

(a) placing a functional block;

(b) placing an on-chip capacitor in an area which is vacant after said step (a) has been carried out;

(c) overlapping a portion of said functional block having been placed in said step (a) and a portion of said on-chip capacitor having been placed in said step (b) with each other creating a vacant area; and (d) placing an on-chip capacitor in said vacant area caused by carrying out said step (c).

15. An apparatus for designing a layout of functional blocks and on-chip capacitors in a semiconductor integrated circuit, comprising:

a functional block placer which places a functional block;

a first on-chip capacitor placer which places an on-chip capacitor in an area which remains vacant after said functional block has been placed by said functional block placer;

an overlapping unit which overlaps a portion of said functional block having been placed by said functional block placer and a portion of said on-chip capacitor having been placed by said on-chip capacitor placer with each other creating a vacant area; and a second on-chip capacitor placer which places an on-chip capacitor in said vacant area resulted from overlapping said portions of said functional block and said on-chip capacitor.

16. The apparatus as set forth in claim 15, wherein said overlapping unit carries out:

judging whether it is possible to overlap said functional blocks and said on-chip capacitor having been placed by said first on-chip capacitor placer with each other based upon an order of a predetermined priority assigned to all of the functional blocks having been placed by said functional block placer; and overlapping said functional blocks and said on-chip capacitor with each other based on said judging.

17. The apparatus as set forth in claim 15, wherein said second on-chip capacitor placer is adapted to replace said on-chip capacitor having been overlapped by said overlapping unit with said first on-chip capacitor upon determining there exists a library of a first on-chip capacitor having a size equal to a sum of a size of said on-chip capacitor having been overlapped by said overlapping unit and a size of said vacant area.

18. The apparatus as set forth in claim 17, wherein said second on-chip capacitor placer carries out the replacement to all of the on-chip capacitors having been placed by said first on-chip capacitor placer in an order of a priority assigned to the functional blocks placed adjacent to said on-chip capacitors.

19. The apparatus as set forth in claim 17, wherein said second on-chip capacitor placer includes a third on-chip capacitor placer is adapted to place an on-chip capacitor in said vacant area, said on-chip capacitor being equal in size to said vacant area upon determining there does not exist a library of a first on-chip capacitor having a size equal to a sum of a size of said on-chip capacitor having been overlapped by said overlapping unit and a size of said vacant area.

20. The apparatus as set forth in claim 19, wherein said third on-chip capacitor placer places said on-chip capacitor such that said on-chip capacitor overlaps an on-chip capacitor disposed adjacent to said on-chip capacitor.

21. The apparatus as set forth in claim 17, further comprising an on-chip capacitor merger is adapted to replace said two on-chip capacitors with a single on-chip capacitor having a size equal to said sum upon determining there exists a library of an on-chip capacitor having a size equal to a sum of sizes of two on-chip capacitors disposed adjacent to each other, replaces.

22. The apparatus as set forth in claim 21, wherein upon determining there does not exist a library of an on-chip capacitor having a size equal to a sum of sizes of two on-chip capacitors disposed adjacent to each other, and there exists a vacant area between said two on-chip capacitors, said on-chip capacitor merger places an on-chip capacitor in said vacant area such that said on-chip capacitor overlaps said two on-chip capacitors.

23. The apparatus as set forth in claim 15, wherein said second on-chip capacitor placer carries out:
  sorting all of the functional blocks having been placed by said functional block placer, in an order of a predetermined priority assigned to said functional blocks;
  successively changing a target functional block in accordance with the order resulted from said sorting;
  judging whether an on-chip capacitor is disposed adjacent to said target functional block, a vacant area exists adjacent to said on-chip capacitor, and another functional block is disposed adjacent to said vacant area;
  comparing a priority assigned to said another functional block with a priority assigned to said target on-chip capacitor, upon determining said another functional block is judged to be disposed adjacent to said vacant area; and
  replacing said on-chip capacitor with an on-chip capacitor having a size equal to a sum of a size of said on-chip capacitor and a size of said vacant area, upon determining a priority assigned to said target on-chip capacitor is judged higher than a priority assigned to said another functional block.

24. The apparatus as set forth in claim 23, wherein said second on-chip capacitor placer is adapted to replace said on-chip capacitor with an on-chip capacitor having a size equal to a sum of a size of said on-chip capacitor and a half of a size of said vacant area upon determining a priority assigned to said target functional block is judged equal to a priority assigned to said another o functional block.

25. The apparatus as set forth in claim 23, wherein said second on-chip capacitor placer is adapted to upon determining a priority assigned to said another functional block is judged higher than a priority assigned to said target functional block, leaving said vacant area vacant.

26. The apparatus as set forth in claim 15, further comprising a database storing libraries of functional blocks and libraries of on-chip capacitors having different sizes from one another,
  wherein a layout of an output inverter of said functional blocks and a layout of a power-source terminal of said on-chip capacitors are standardized into several layouts, an output inverter and a power-source terminal associated with each other with respect to a layout can be overlapped each other, and power-source terminals associated with each other with respect to a layout can be overlapped each other.

* * * * *